US009659776B2

(12) United States Patent
Chen et al.

(10) Patent No.: US 9,659,776 B2
(45) Date of Patent: May 23, 2017

(54) DOPING FOR FINFET

(71) Applicant: Taiwan Semiconductor Manufacturing Company, Ltd., Hsin-Chu (TW)

(72) Inventors: Hung-Kai Chen, Taichung (TW); Tsung-Hung Lee, Hsin-Chu (TW); Han-Pin Chung, Fongshan (TW); Shih-Syuan Huang, Taichung (TW); Chun-Fu Cheng, Zhubei (TW); Chien-Tai Chan, Hsin-Chu (TW); Kuang-Yuan Hsu, Taichung (TW); Hsien-Chin Lin, Hsin-Chu (TW); Ka-Hing Fung, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/153,585

(22) Filed: May 12, 2016

(65) Prior Publication Data

US 2016/0260610 A1   Sep. 8, 2016

Related U.S. Application Data

(62) Division of application No. 14/186,910, filed on Feb. 21, 2014, now Pat. No. 9,362,404.

(51) Int. Cl.
*H01L 23/04*    (2006.01)
*H01L 21/225*   (2006.01)
*H01L 29/78*    (2006.01)
*H01L 29/06*    (2006.01)
*H01L 21/8238*  (2006.01)
(Continued)

(52) U.S. Cl.
CPC .. *H01L 21/2251* (2013.01); *H01L 21/823821* (2013.01); *H01L 21/845* (2013.01); *H01L 29/0657* (2013.01); *H01L 29/6656* (2013.01); *H01L 29/66795* (2013.01); *H01L 29/66803* (2013.01); *H01L 29/7851* (2013.01); *H01L 21/2255* (2013.01)

(58) Field of Classification Search
CPC ............ H01L 29/0657; H01L 29/7851; H01L 21/2251; H01L 21/2255
USPC ........................ 257/722, 623; 438/977, 978
See application file for complete search history.

(56) References Cited

U.S. PATENT DOCUMENTS

2007/0075351 A1 * 4/2007 Schulz .............. H01L 21/82382
                                                       257/314
2010/0308414 A1   12/2010 Dixit
2011/0018064 A1    1/2011 Doornbos
(Continued)

*Primary Examiner* — Long K Tran
(74) *Attorney, Agent, or Firm* — Slater Matsil, LLP

(57) ABSTRACT

First and second fins are formed extending from a substrate. A first layer is formed over the first fin. The first layer comprises a first dopant. A portion of the first layer is removed from a tip portion of the first fin. A second layer is formed over the second fin. The second layer comprises a second dopant. One of the first and second dopants is a p-type dopant, and the other of the first and second dopants is an n-type dopant. A portion of the second layer is removed from a tip portion of the second fin. A solid phase diffusion process is performed to diffuse the first dopant into a non-tip portion of the first fin, and to diffuse the second dopant into a non-tip portion of the second fin.

20 Claims, 21 Drawing Sheets

(51) Int. Cl.
*H01L 21/84* (2006.01)
*H01L 29/66* (2006.01)

(56) References Cited

U.S. PATENT DOCUMENTS

| | | |
|---|---|---|
| 2013/0122676 A1 | 5/2013 | Jeng |
| 2013/0168748 A1* | 7/2013 | Bao ................... H01L 21/82380 257/288 |
| 2014/0077331 A1* | 3/2014 | Hu ...................... H01L 27/0629 257/499 |
| 2014/0117426 A1 | 5/2014 | Cho et al. |

* cited by examiner

DOPING FOR FINFET

This is a divisional application of U.S. application Ser. No. 14/186,910, entitled "Doping for FinFET" which was filed on Feb. 21, 2014 and is incorporated herein by reference

BACKGROUND

The present disclosure relates to fin field-effect-transistors (FinFETs) in general, particularly with regard to doped regions thereof.

The manufacture of FinFET devices currently includes dopant implantation processes intended to achieve regions of certain dopant concentrations. For example, anti-punch through regions may be formed in or near base portions of the FinFET fin elements by implanting the appropriate dopant until a desired concentration is achieved. However, the fins are generally formed with a relatively high aspect ratio, such that even with the maximum attainable implant angle, the resulting dopant concentration may vary along the vertical length of the fins. Consequently, mobility and/or leakage current may be adversely affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
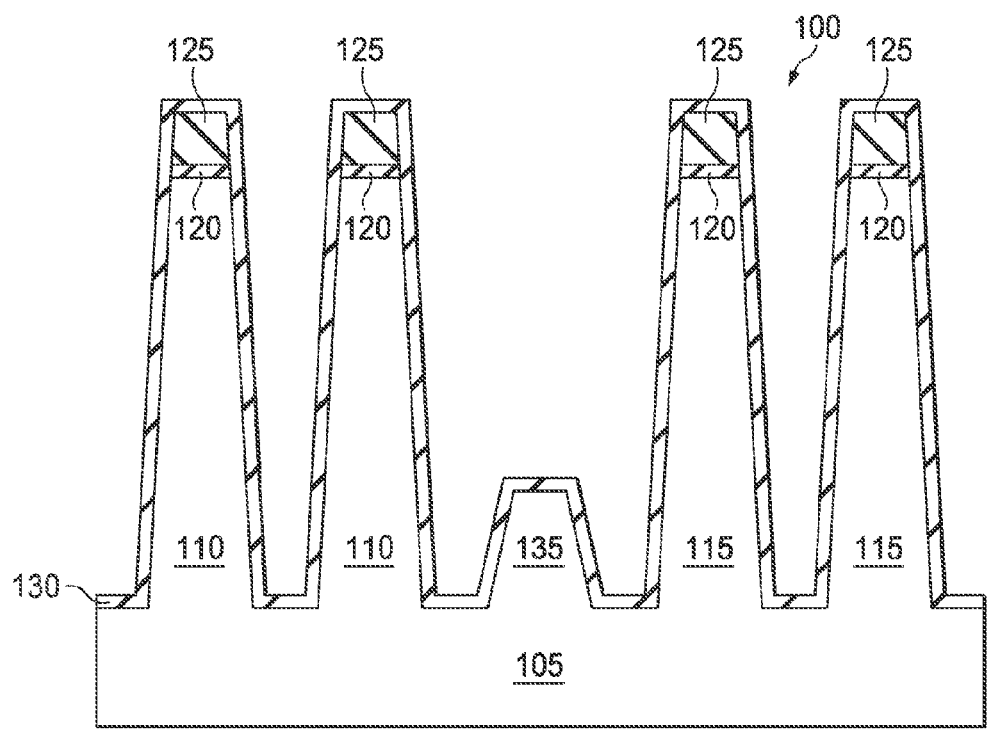
FIG. 1 is a sectional view of at least a portion of an apparatus in an intermediate stage of manufacture in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure introduces improved FinFET devices, such as may have dopant concentrations that are better controlled and/or that exhibit greater uniformity. Other aspects introduced in the present disclosure relate to, for example, the ability to tune certain structural dimensions, such as those affecting resistance, mobility, and/or leakage in those and surrounding structures.

FIG. 1 is a sectional view of at least a portion of an apparatus 100 in an intermediate stage of manufacture according to one or more aspects of the present disclosure. The apparatus 100 includes a substrate 105, first fins 110 extending from the substrate 105, and second fins 115 extending from the substrate 105 and laterally offset from the first fins 110. The substrate 105 may comprise bulk silicon, strained silicon, silicon germanium, and/or other materials. The substrate 105 may also be or comprise a silicon-on-insulator (SOI) substrate, such as a silicon-on-sapphire substrate, a silicon germanium-on-insulator substrate, and/or another substrate comprising an epitaxial semiconductor layer on an insulator layer. However, the substrate 105 may comprise additional or alternative materials within the scope of the present disclosure. The substrate 105 may have a <100>, <110>, <111>, or other surface orientation. The substrate 105 may also comprise at least portions of one or more active and/or passive devices (not shown), such as transistors, capacitors, resistors, inductors, and/or other devices that may be utilized to generate the desired structural and functional requirements of the design. Such devices may be formed by any suitable methods, whether below, within, and/or on the surface of the substrate 105.

The first and second fins 110 and 115 may be formed by any conventional and/or future-developed processes. One or more of a dielectric layer 120 and/or a CMP (chemical-mechanical planarization) stop layer 125 may cover at least a portion of an end of each of the fins 110 and 115. The dielectric layer 120 may comprise silicon dioxide, silicon oxynitride, and/or other dielectric materials, and the CMP stop layer 125 may comprise silicon nitride, titanium nitride, and/or other etchant selectable materials.

The apparatus 100 also comprises a liner layer 130 substantially covering the fins 110 and 115, the dielectric layer 120, and the etch stop layer 125. The liner layer 130 may also cover one or more spacers and/or other features 135 extending from the substrate between the ones of the first and second fins 110 and 115. The liner layer 130 may comprise silicon oxide and/or other oxide compositions, and may be formed by sputtering, chemical-vapor deposition (CVD), plasma-enhanced CVD (PECVD), metal organic CVD (MOCVD), furnace CVD (FCVD), atomic layer deposition (ALD), plasma-enhanced ALD (PEALD), and/or other processes. The thickness of the liner layer 130 may range between about one nanometer and about ten microns, although other thicknesses are also within the scope of the present disclosure.

Figure 2:
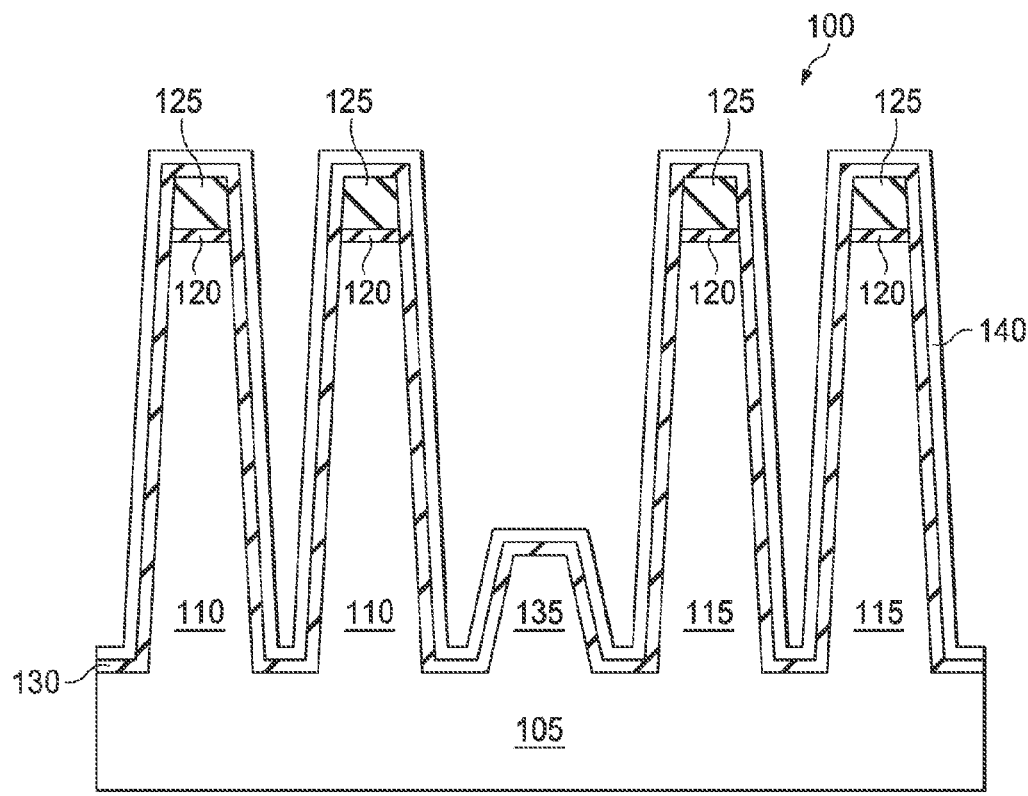
FIG. 2 is a sectional view of the apparatus shown in FIG. 1 in a subsequent stage of manufacture in accordance with some embodiments.

FIG. 2 is a sectional view of the apparatus 100 shown in FIG. 1 in which a first dopant layer 140 has been formed over the liner layer 130 according to one or more aspects of the present disclosure. The first dopant layer 140 may comprise phosphosilicate glass (PSG), borosilicate glass (BSG), borophosphosilicate glass (BPSG), and/or other materials that comprise a dopant susceptible to subsequent diffusion into the fins 110 and/or 115. Sputtering, CVD, PECVD, MOCVD, FCVD, ALD, PEALD, and/or other processes may be utilized to form the first dopant layer 140. The thickness of the first dopant layer 140 may range between about one nanometer and about twenty microns, although other thicknesses are also within the scope of the present disclosure.

Figure 3:
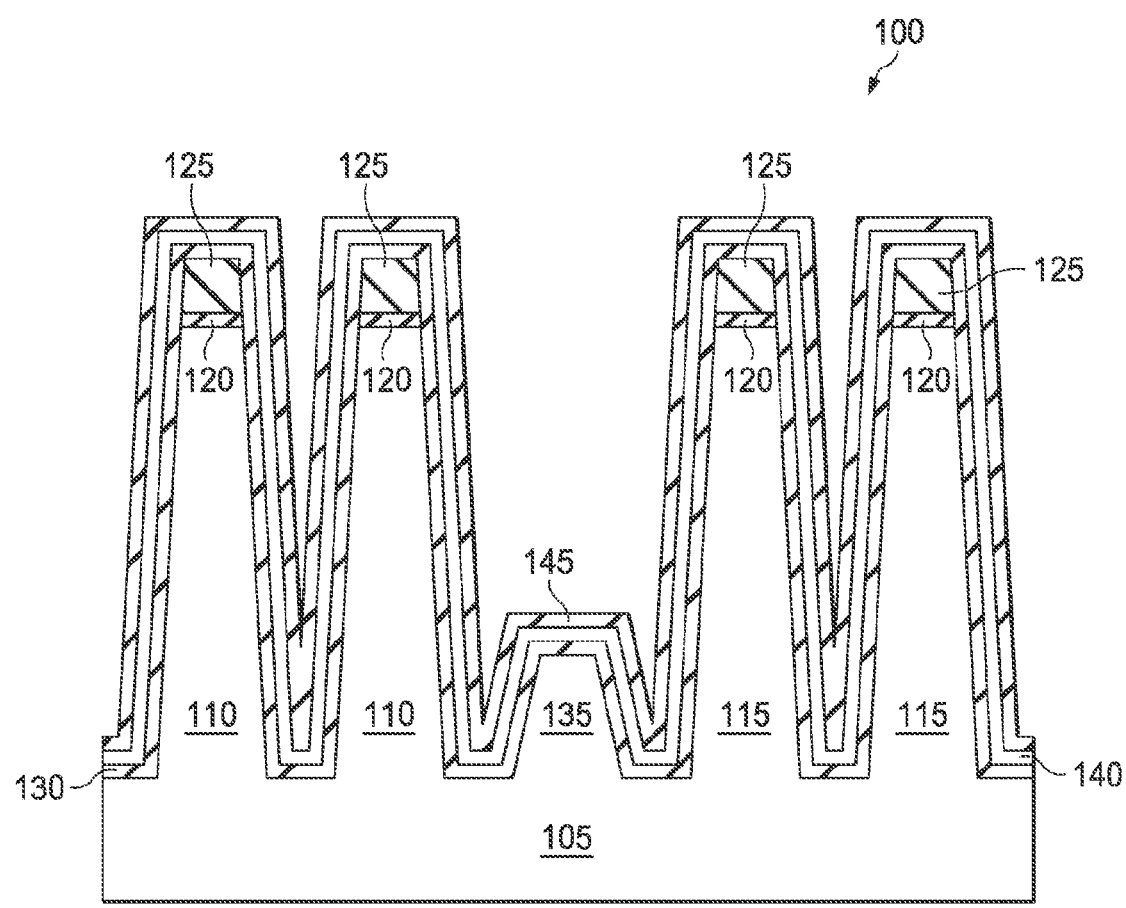
FIG. 3 is a sectional view of the apparatus shown in FIG. 2 in a subsequent stage of manufacture in accordance with some embodiments.

FIG. 3 is a sectional view of the apparatus 100 shown in FIG. 2 in which an etch stop layer 145 has been formed over the first dopant layer 140 according to one or more aspects of the present disclosure. The etch stop layer 145 may comprise silicon nitride, titanium nitride, and/or other etchant selectable materials, and may be formed by sputtering, CVD, PECVD, MOCVD, FCVD, ALD, PEALD, and/or other processes. The thickness of the etch stop layer 145 may range between about one nanometer and about twenty microns, although other thicknesses are also within the scope of the present disclosure.

Figure 4:
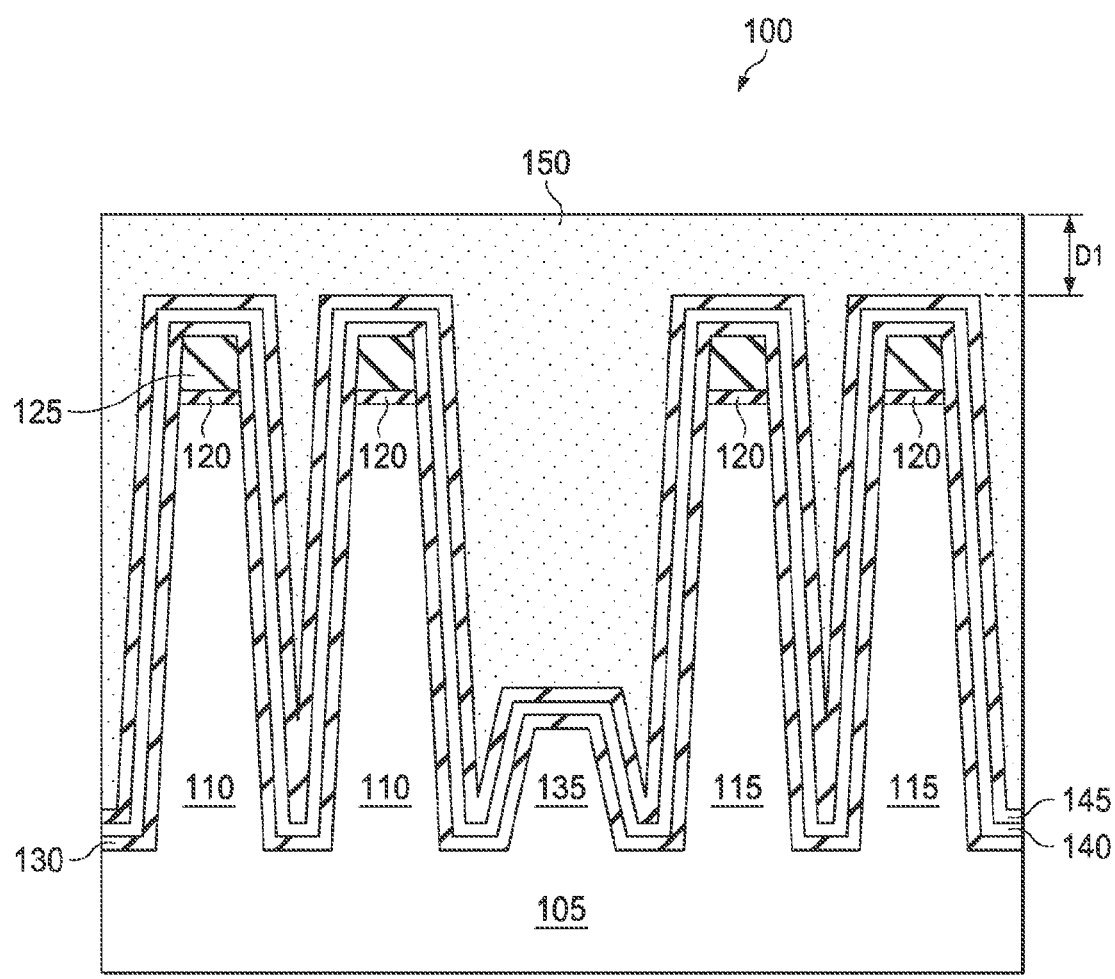
FIG. 4 is a sectional view of the apparatus shown in FIG. 3 in a subsequent stage of manufacture in accordance with some embodiments.

FIG. 4 is a sectional view of the apparatus 100 shown in FIG. 3 in which a bottom anti-reflective coating (BARC) 150 has been formed over the etch stop layer 145 according to one or more aspects of the present disclosure. The BARC 150 may comprise silicon oxynitride and/or other organic or inorganic materials, and may be formed to a distance D1 above an uppermost portion of the etch stop layer 145, thus filling in the spaces between the fins 110 and 115 and/or other features 135. The distance D1 may range between about ten nanometers and about 1000 nanometers, although other thicknesses are also within the scope of the present disclosure. One or more CVD, spin-on coating, and/or other processes may be utilized to form the BARC 150.

Figure 5:
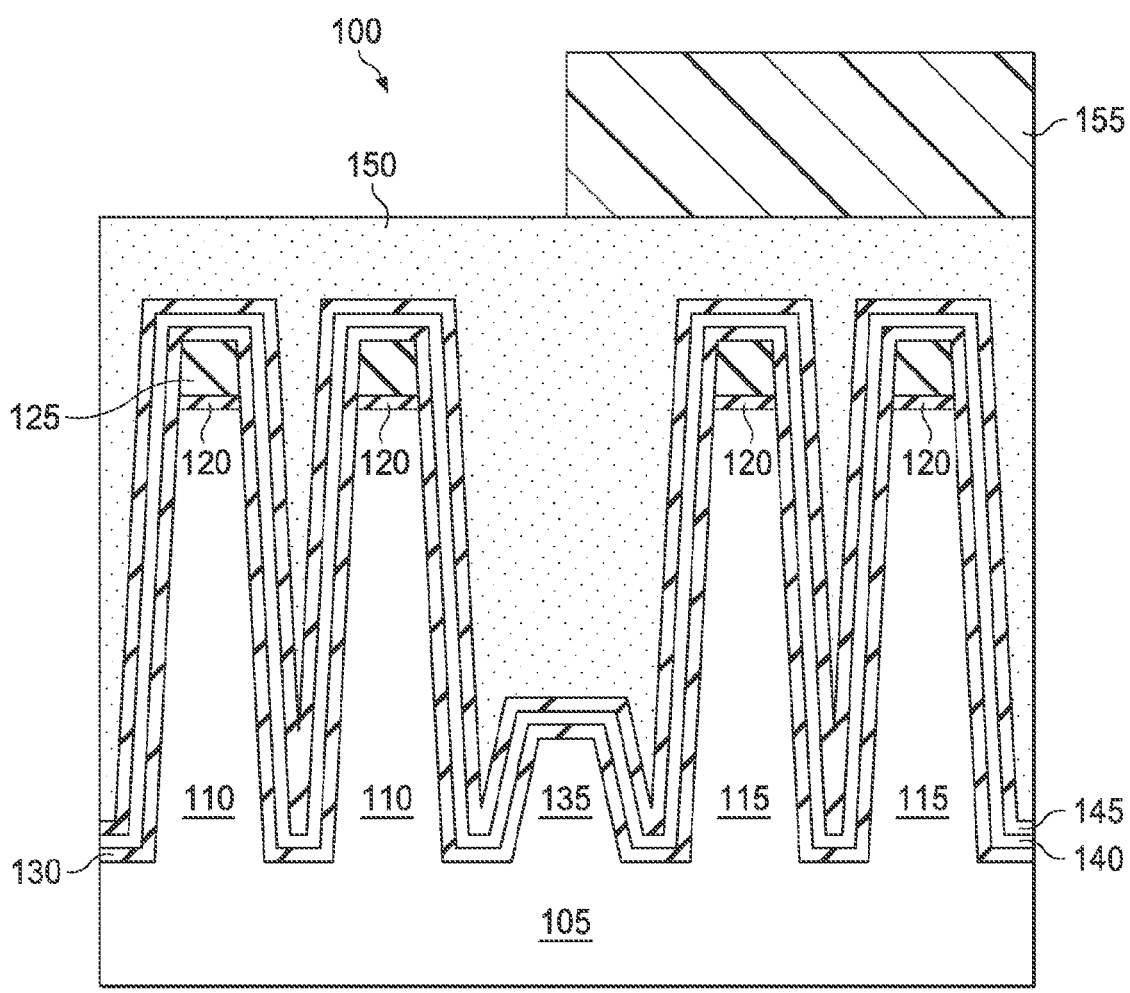
FIG. 5 is a sectional view of the apparatus shown in FIG. 4 in a subsequent stage of manufacture in accordance with some embodiments.

FIG. 5 is a sectional view of the apparatus 100 shown in FIG. 4 in which a photoresist layer 155 has been formed over the BARC 150 and subsequently patterned to overlie the second fins 115 but not the first fins 110. The photoresist layer 155 may be deposited by spin-on coating and/or other processes, and then exposed to the desired pattern and subsequently developed.

Figure 6:
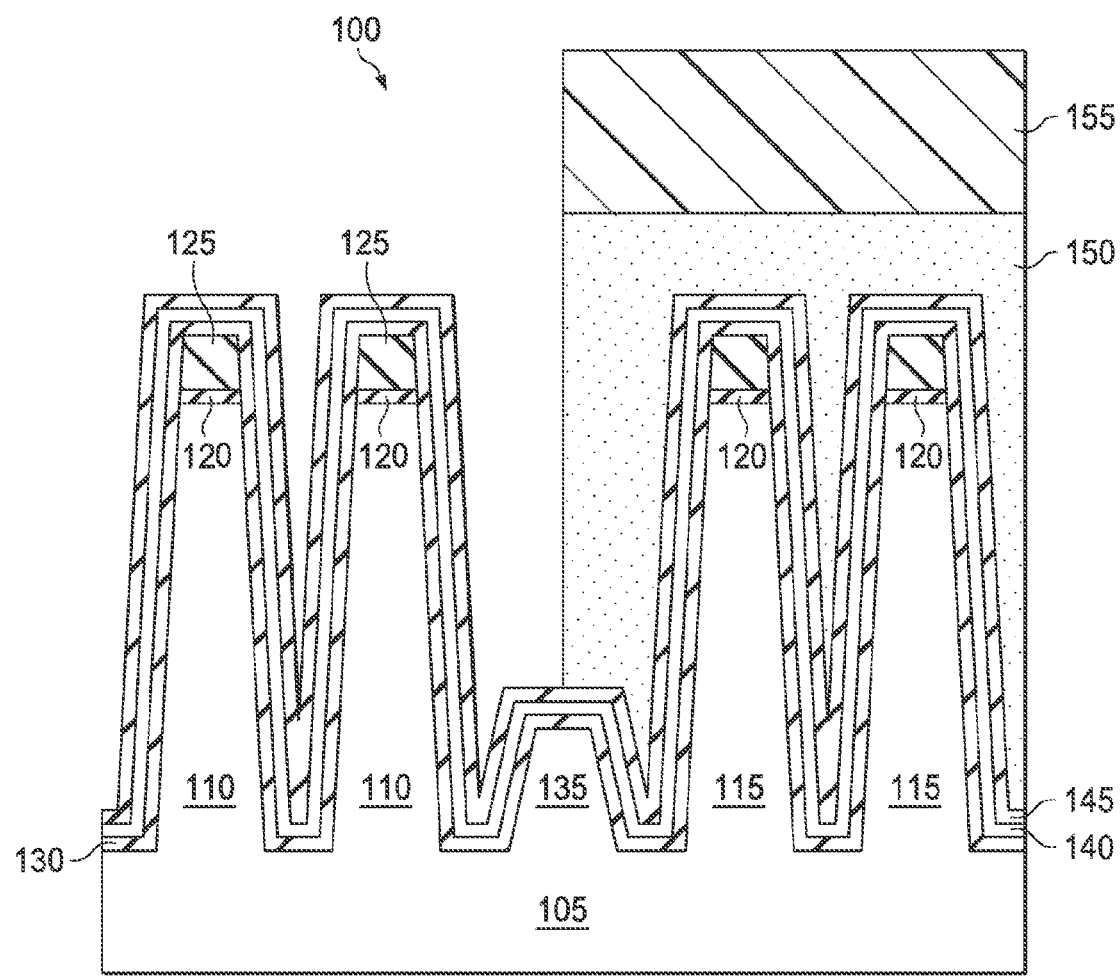
FIG. 6 is a sectional view of the apparatus shown in FIG. 5 in a subsequent stage of manufacture in accordance with some embodiments.

FIG. 6 is a sectional view of the apparatus 100 shown in FIG. 5 in which the patterned photoresist layer 155 has been utilized to pattern the underlying BARC 150, thus exposing the etch stop layer 145 over the first fins 110. Such patterning may utilize one or more dry, isotropic, and/or other etching processes.

Figure 7:
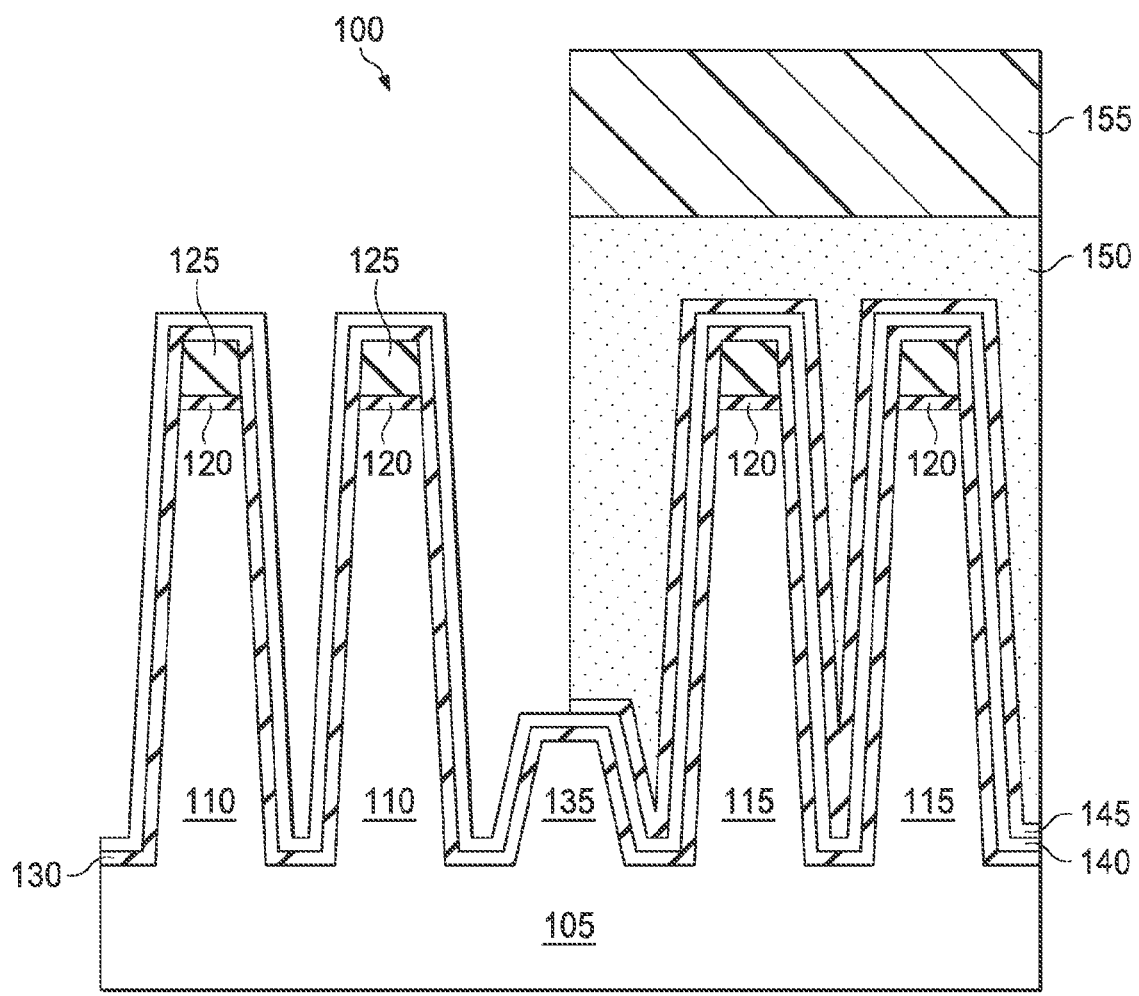
FIG. 7 is a sectional view of the apparatus shown in FIG. 6 in a subsequent stage of manufacture in accordance with some embodiments.

FIG. 7 is a sectional view of the apparatus 100 shown in FIG. 6 in which the patterned photoresist layer 155 and remaining portion of the BARC 150 have been utilized to pattern the underlying etch stop layer 145, thus exposing the first dopant layer 140 over the first fins 110. Such patterning may utilize one or more dry, isotropic, and/or other etching processes.

Figure 8:
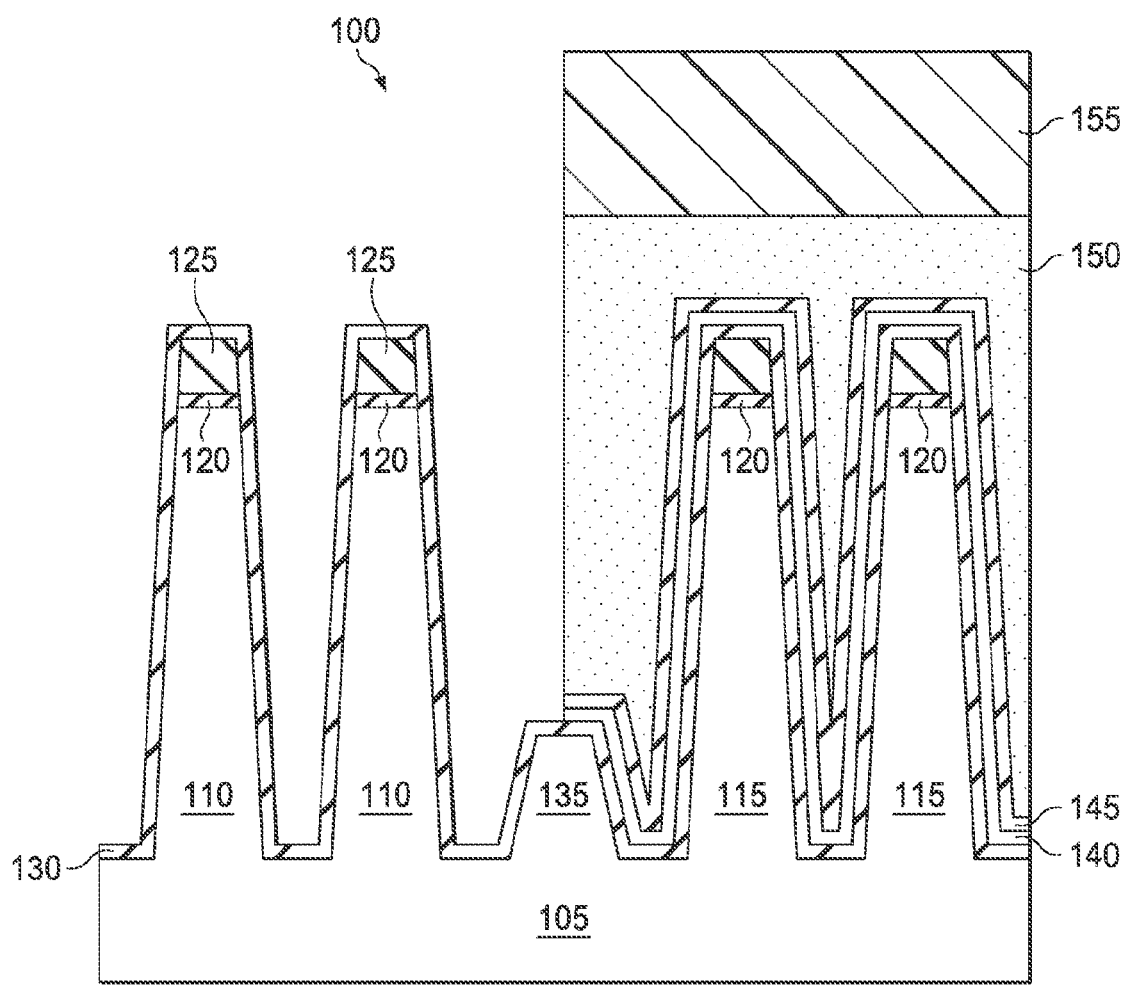
FIG. 8 is a sectional view of the apparatus shown in FIG. 7 in a subsequent stage of manufacture in accordance with some embodiments.

FIG. 8 is a sectional view of the apparatus 100 shown in FIG. 7 in which the patterned photoresist layer 155 and remaining portions of the BARC 150 and the etch stop layer 145 have been utilized to pattern the underlying first dopant layer 140, thus exposing the liner layer 130 over the first fins 110. Such patterning may utilize one or more dry and/or wet isotropic and/or anisotropic etching and/or other material removal and/or cleaning processes.

In some implementations, the patterning performed to remove portions of the BARC 150, the etch stop layer 145, and/or the first dopant layer 140 may be substantially the same process. That is, two or more of the BARC 150, the etch stop layer 145, and/or the first dopant layer 140 may be patterned substantially simultaneously.

Figure 9:
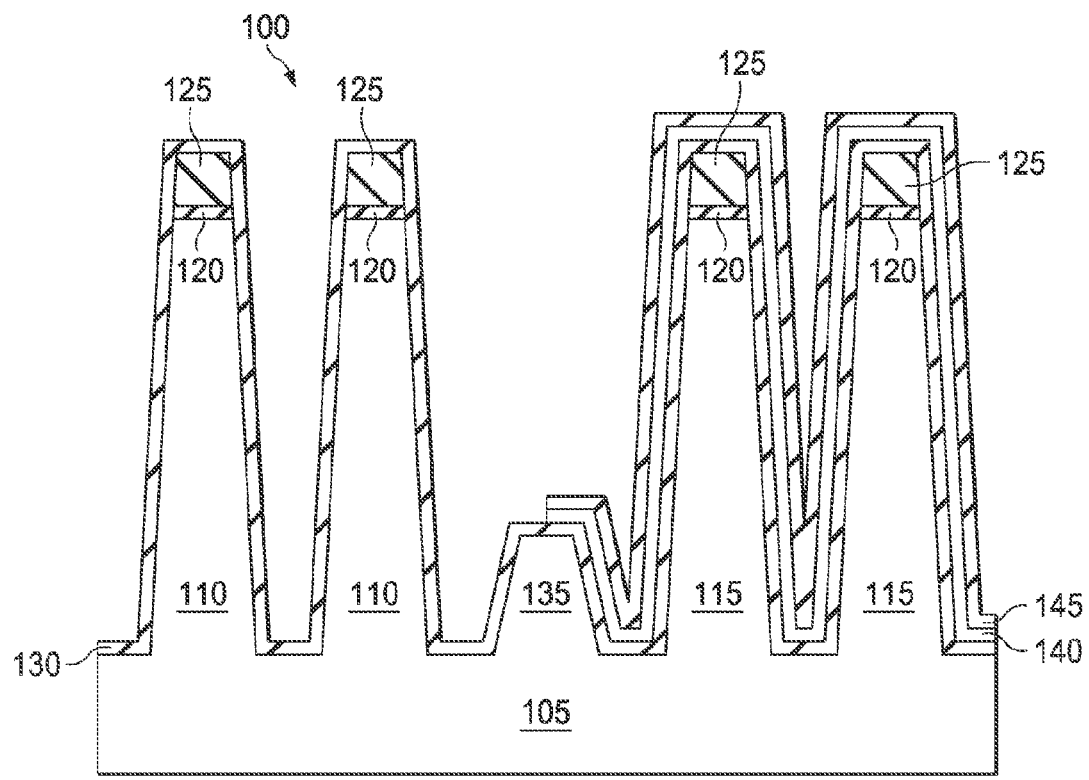
FIG. 9 is a sectional view of the apparatus shown in FIG. 8 in a subsequent stage of manufacture in accordance with some embodiments.

FIG. 9 is a sectional view of the apparatus 100 shown in FIG. 8 in which the remaining portion of the BARC 150 and the photoresist layer 155 have been removed according to one or more aspects of the present disclosure. Such removal may comprise one or more wet and/or dry isotropic and/or anisotropic etching and/or other material removal and/or cleaning processes. For example, the removal may utilize one or more high temperature and/or other sulfuric peroxide mixtures, although other material removal compositions and/or processes are also within the scope of the present disclosure.

Figure 10:
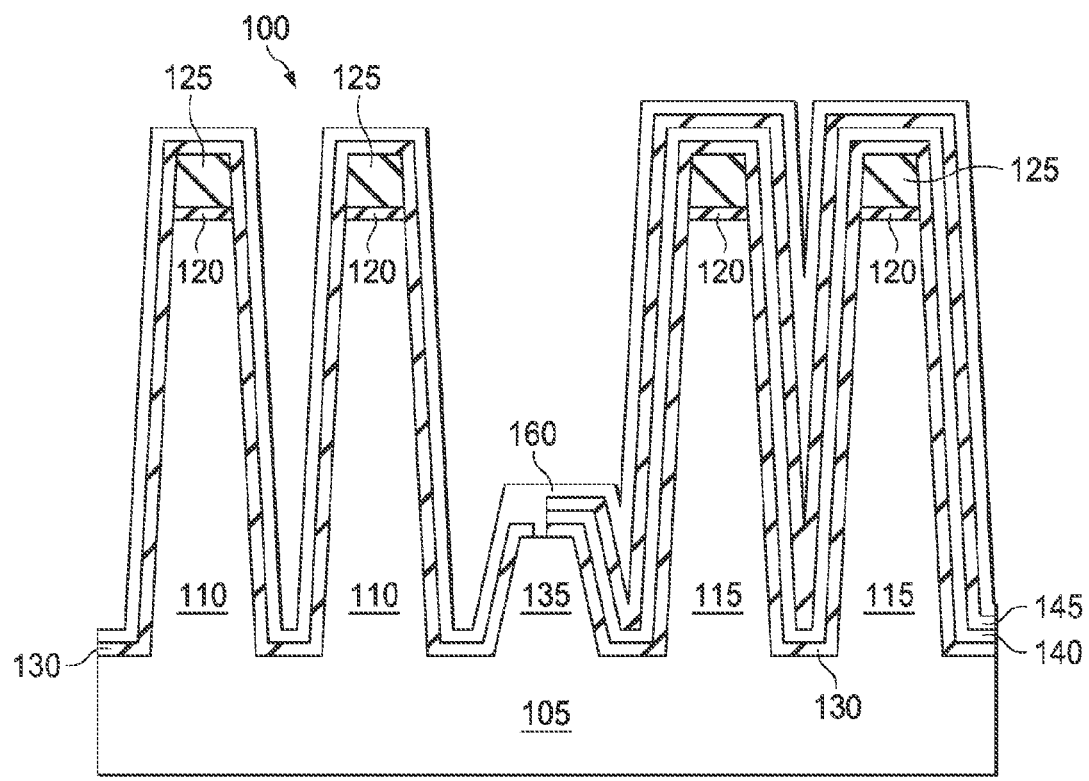
FIG. 10 is a sectional view of the apparatus shown in FIG. 9 in a subsequent stage of manufacture in accordance with some embodiments.

FIG. 10 is a sectional view of the apparatus 100 shown in FIG. 9 in which a second dopant layer 160 has been formed over the first fins 110 (e.g., over the liner layer 130) and the second fins 115 (e.g., over the remaining portion of the etch stop layer 145). The second dopant layer 160 may comprise PSG, BSG, BPSG, and/or other materials comprising a dopant susceptible to subsequent diffusion into the fins 110. The dopant type of the second dopant layer 160 may be opposite the dopant type of the first dopant layer 140. For example, in implementations in which the first dopant layer 140 comprises PSG and/or another n-type dopant, the second dopant layer 160 may comprise BSG and/or another p-type dopant. Sputtering, CVD, PECVD, MOCVD, FCVD, PEALD, ALD, and/or other processes may form the second dopant layer 160. The thickness of the second dopant layer 160 may range between about one micron and about twenty microns, although other thicknesses are also within the scope of the present disclosure.

The first dopant layer 140 may comprise a first non-implanted dopant according to a first concentration profile that varies substantially only in a direction perpendicular to a nearest portion of the first dopant layer 140. Similarly, the second dopant layer 160 may comprise a second non-implanted dopant according to a second concentration profile that varies substantially only in a direction perpendicular to a nearest portion of the second dopant layer 160. The first concentration profile may be substantially uniform along a direction that is substantially parallel to the nearest portion of the first dopant layer 140. Similarly, the second concentration profile may be substantially uniform along a direction that is substantially parallel to the nearest portion of the second dopant layer 160. The first and second concentration profiles may each include a maximum concentration ranging between about $1E18$ cm$^{-3}$ and about $1E19$ cm$^{-3}$, although other concentrations are also within the scope of the present disclosure.

Figure 11:
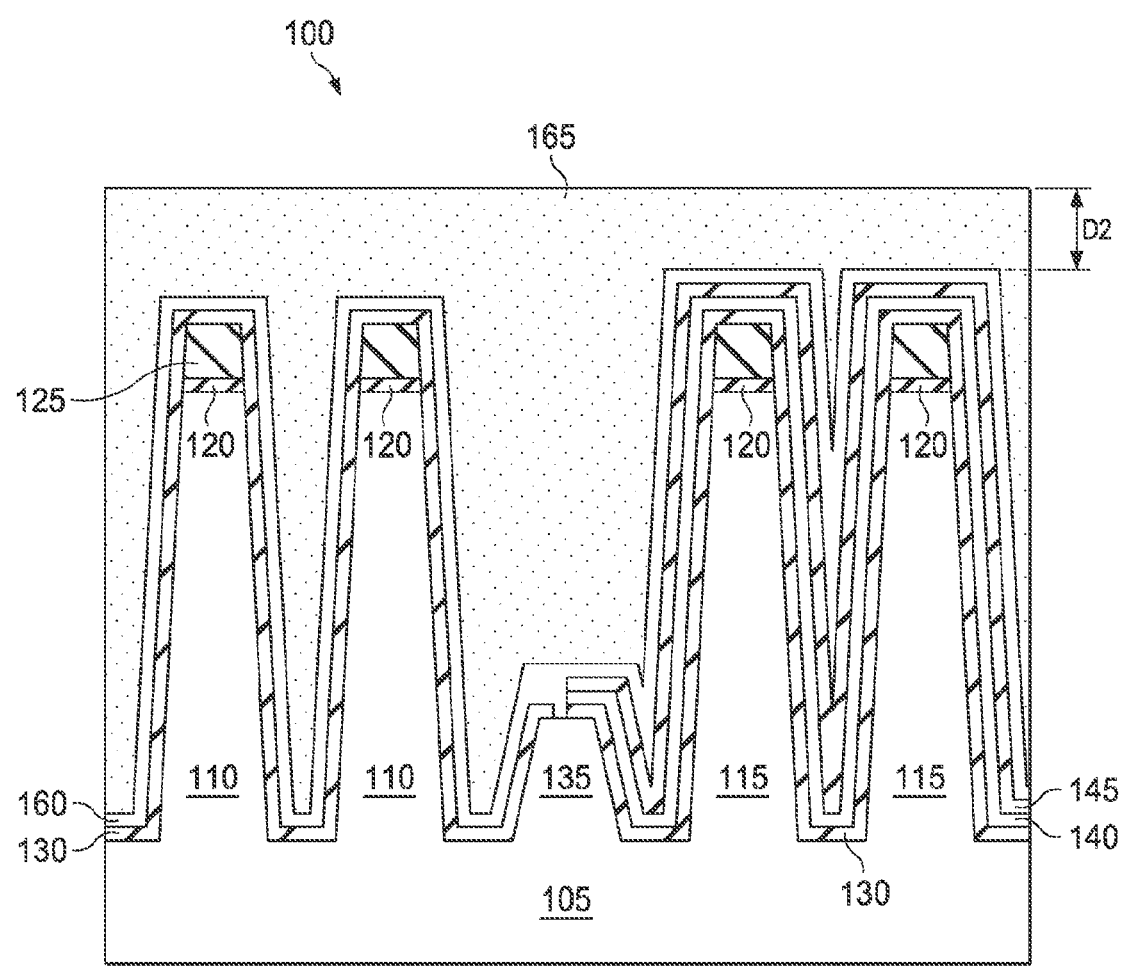
FIG. 11 is a sectional view of the apparatus shown in FIG. 10 in a subsequent stage of manufacture in accordance with some embodiments.

FIG. 11 is a sectional view of the apparatus 100 shown in FIG. 10 in which a BARC 165 has been formed over the second dopant layer 160 according to one or more aspects of the present disclosure. The BARC 165 may comprise silicon oxynitride and/or other organic or inorganic materials, and may be formed to a distance D2 above an uppermost portion of the second dopant layer 160 (relative to the orientation shown in FIG. 11), thus filling in the spaces between the fins 110 and 115 and/or other features 135. The distance D2 may range between about ten microns and about 1000 microns, although other thicknesses are also within the scope of the present disclosure. The BARC 165 may be formed by CVD, spin-on coating, and/or other processes. In some implementations, the BARC 165 may be substantially similar to the BARC 150 with regard to thicknesses, composition, and/or manufacture.

Figure 12:
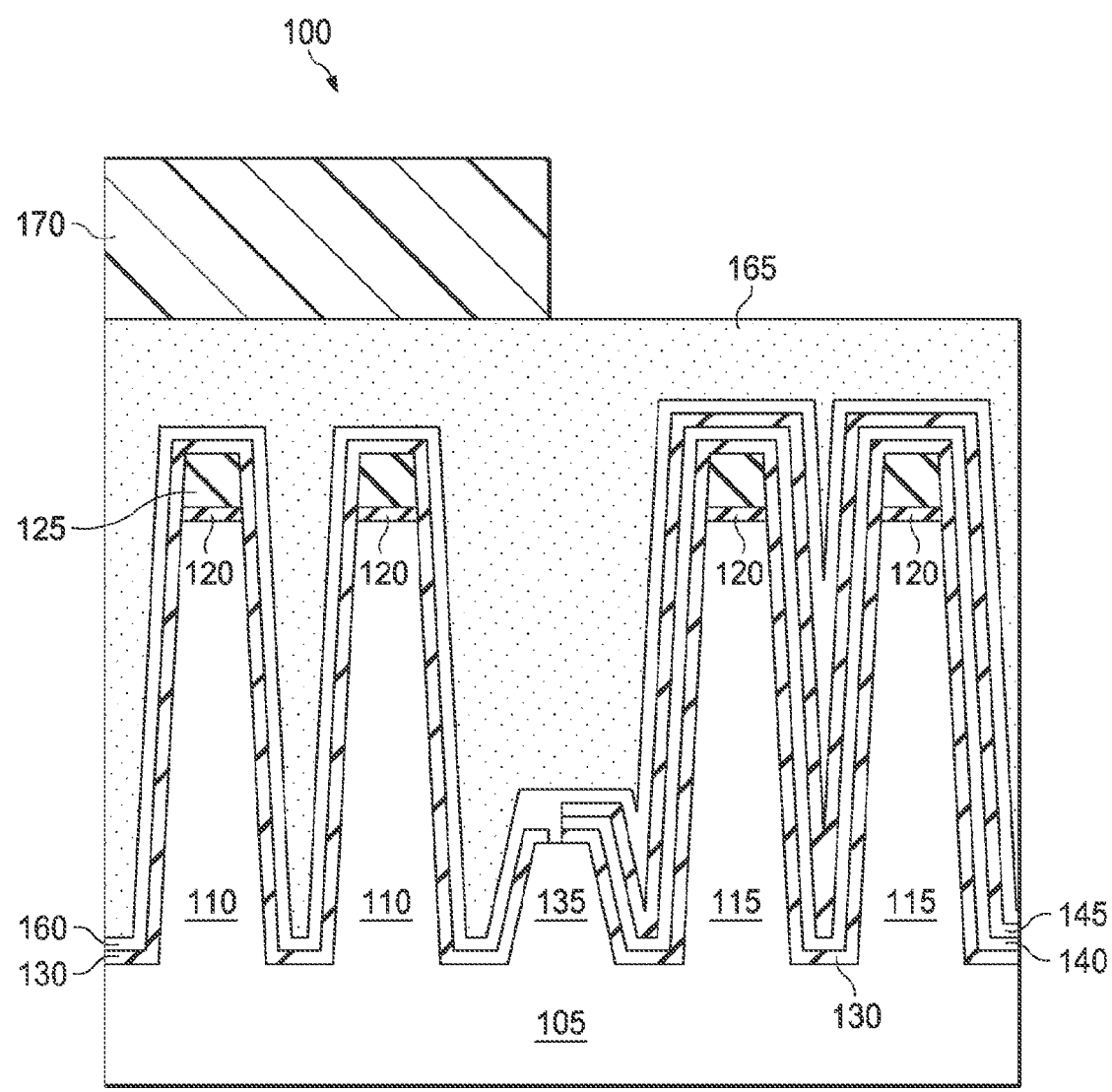
FIG. 12 is a sectional view of the apparatus shown in FIG. 11 in a subsequent stage of manufacture in accordance with some embodiments.

FIG. 12 is a sectional view of the apparatus 100 shown in FIG. 11 in which a photoresist layer 170 has been formed over the BARC 165 and subsequently patterned to overlie the first fins 110 but not the second fins 115. The photoresist layer 170 may be deposited by spin-on coating and/or other processes, and then exposed to the desired pattern and subsequently developed. In some implementations, the photoresist layer 170 may be substantially similar to the photoresist layer 155 with regard to thicknesses, composition, and/or manufacture.

Figure 13:
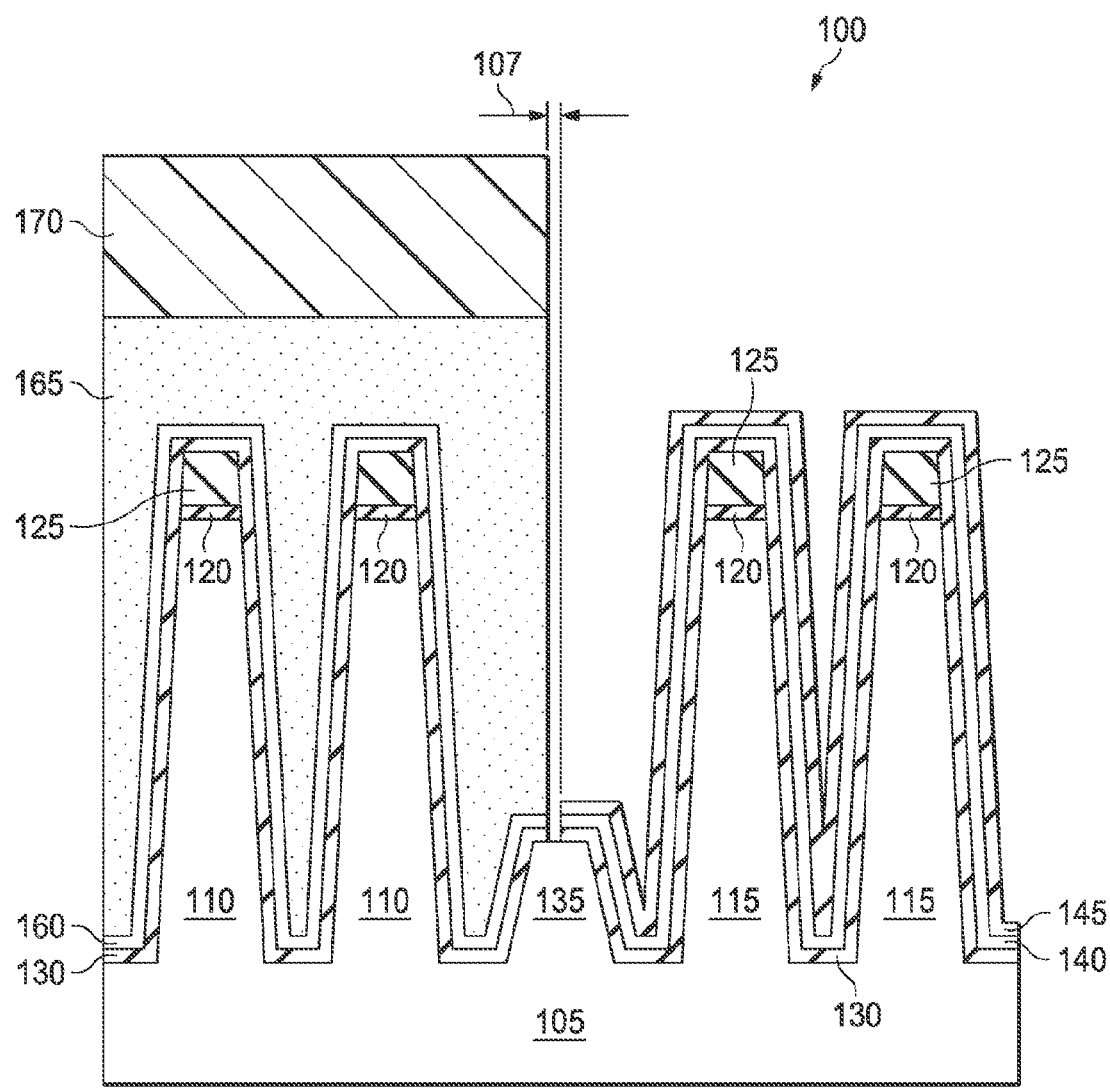
FIG. 13 is a sectional view of the apparatus shown in FIG. 12 in a subsequent stage of manufacture in accordance with some embodiments.

FIG. 13 is a sectional view of the apparatus 100 shown in FIG. 12 in which the patterned photoresist layer 170 has been utilized to pattern the BARC 165 and the second dopant layer 160, thus exposing the etch stop layer 145 over the second fins 115. Such patterning may utilize one or more dry, isotropic, and/or other etching processes.

FIG. 13 also depicts that proximate ends of the first and second dopant layers 145 and 160 may be separated by a gap 107. The gap 107 may be achieved by offsetting the perimeter of the photoresist 170 by a desired amount relative to the lateral boundary of the patterned etch stop layer 145, the first dopant layer 140, and/or the liner layer 130 overlying the second fins 115. The gap 107 may be tunable and/or otherwise range between about one nanometer and about ten nanometers, although other dimensions are also within the scope of the present disclosure.

In some implementations, the patterning performed to remove portions of the BARC 165, the second dopant layer 160, and/or the liner layer 130 may be substantially the same process. That is, two or more of the BARC 165, the second dopant layer 160, and the liner layer 130 may be patterned substantially simultaneously.

Figure 14:
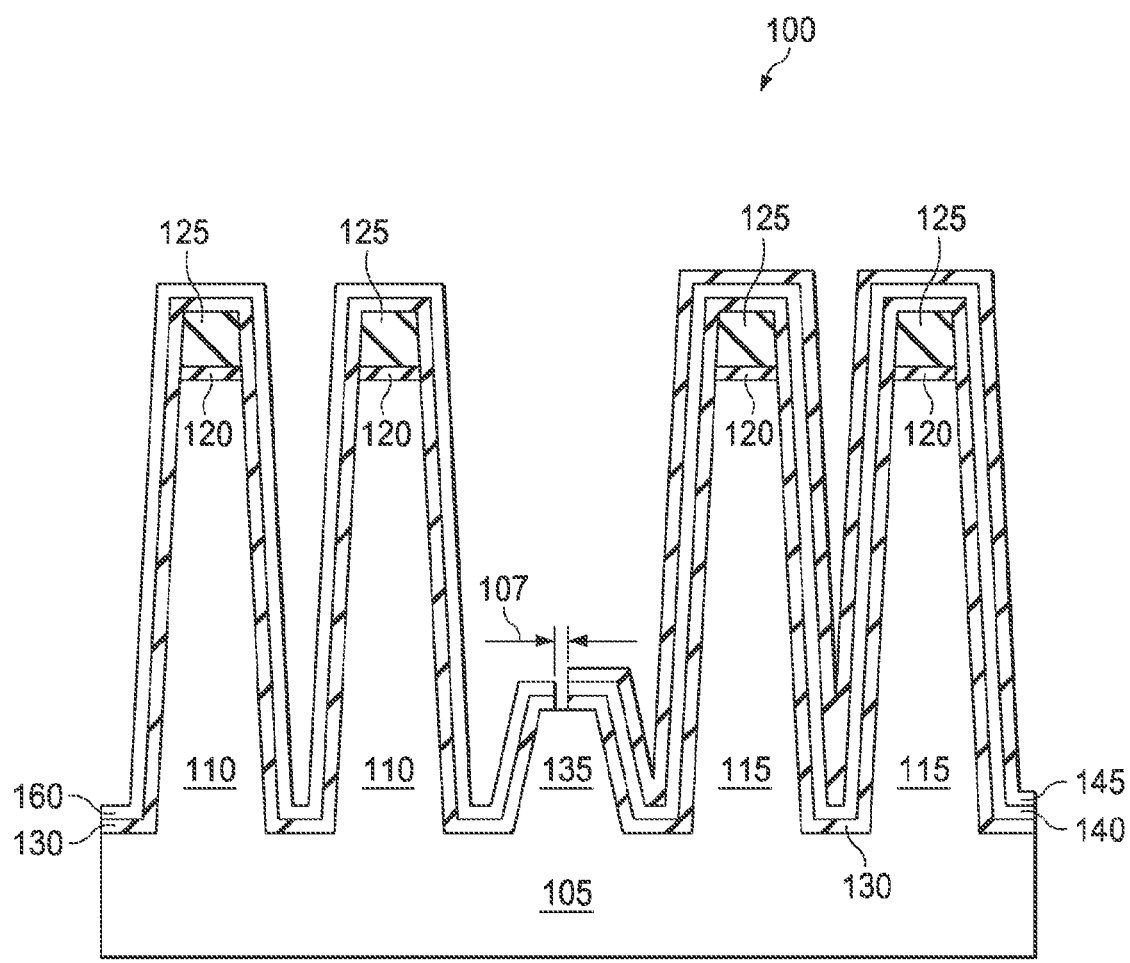
FIG. 14 is a sectional view of the apparatus shown in FIG. 13 in a subsequent stage of manufacture in accordance with some embodiments.

FIG. 14 is a sectional view of the apparatus 100 shown in FIG. 13 in which the remaining portion of the BARC 165 and the photoresist layer 170 have been removed, thus exposing the second dopant layer 160. Such removal may comprise one or more wet and/or dry isotropic and/or anisotropic etching and/or other material removal processes. For example, the removal may utilize one or more high temperature and/or other sulfuric peroxide mixtures, although other material removal compositions and/or processes are also within the scope of the present disclosure.

Figure 15:
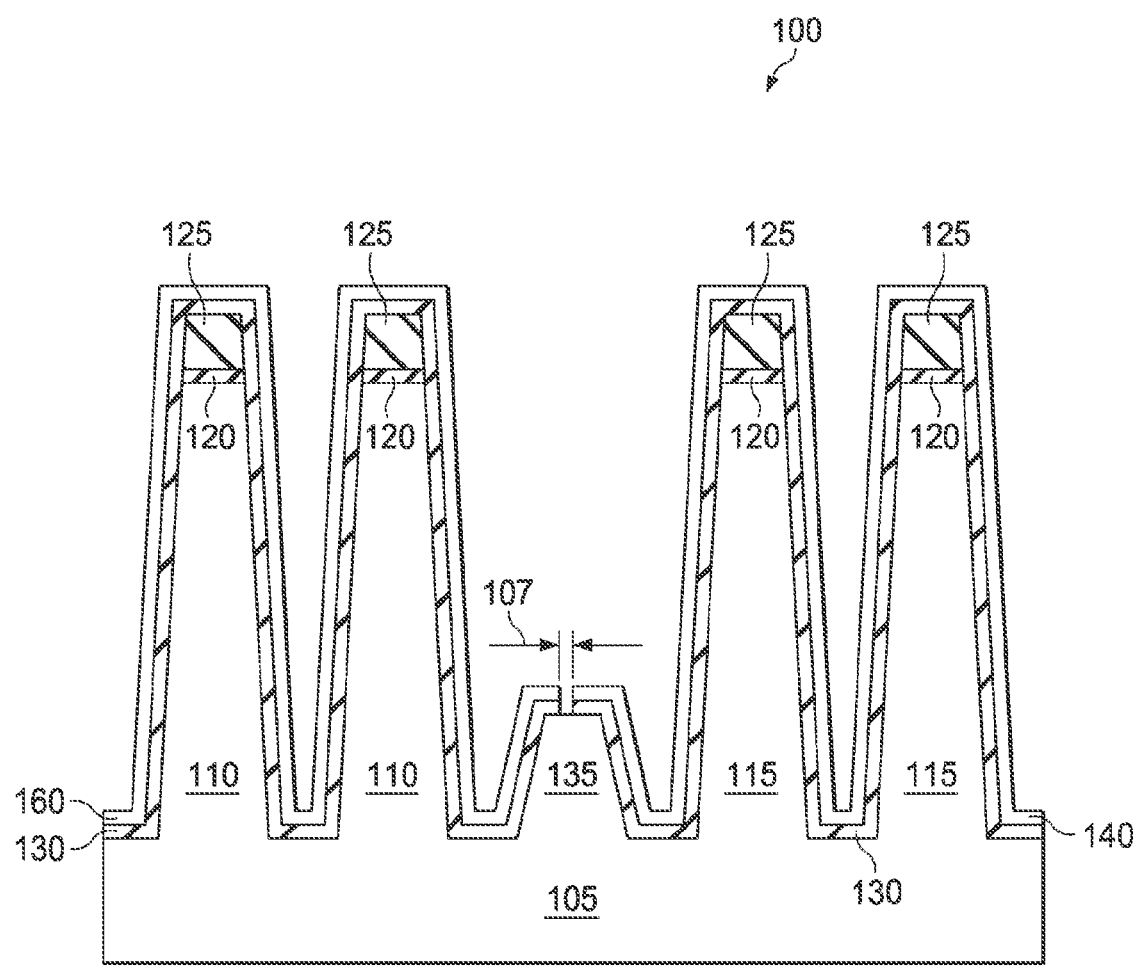
FIG. 15 is a sectional view of the apparatus shown in FIG. 14 in a subsequent stage of manufacture in accordance with some embodiments.

FIG. 15 is a sectional view of the apparatus 100 shown in FIG. 14 in which the remaining portion of the etch stop layer 145 has been removed from over the second fins 115, thus exposing the first dopant layer 140 over the second fins 115. Such removal may utilize one or more wet and/or dry isotropic and/or anisotropic etching and/or other material removal processes. Such removal may also expose a portion of a surface of the substrate 105 and/or feature 135 through the optional gap 107.

Figure 16:
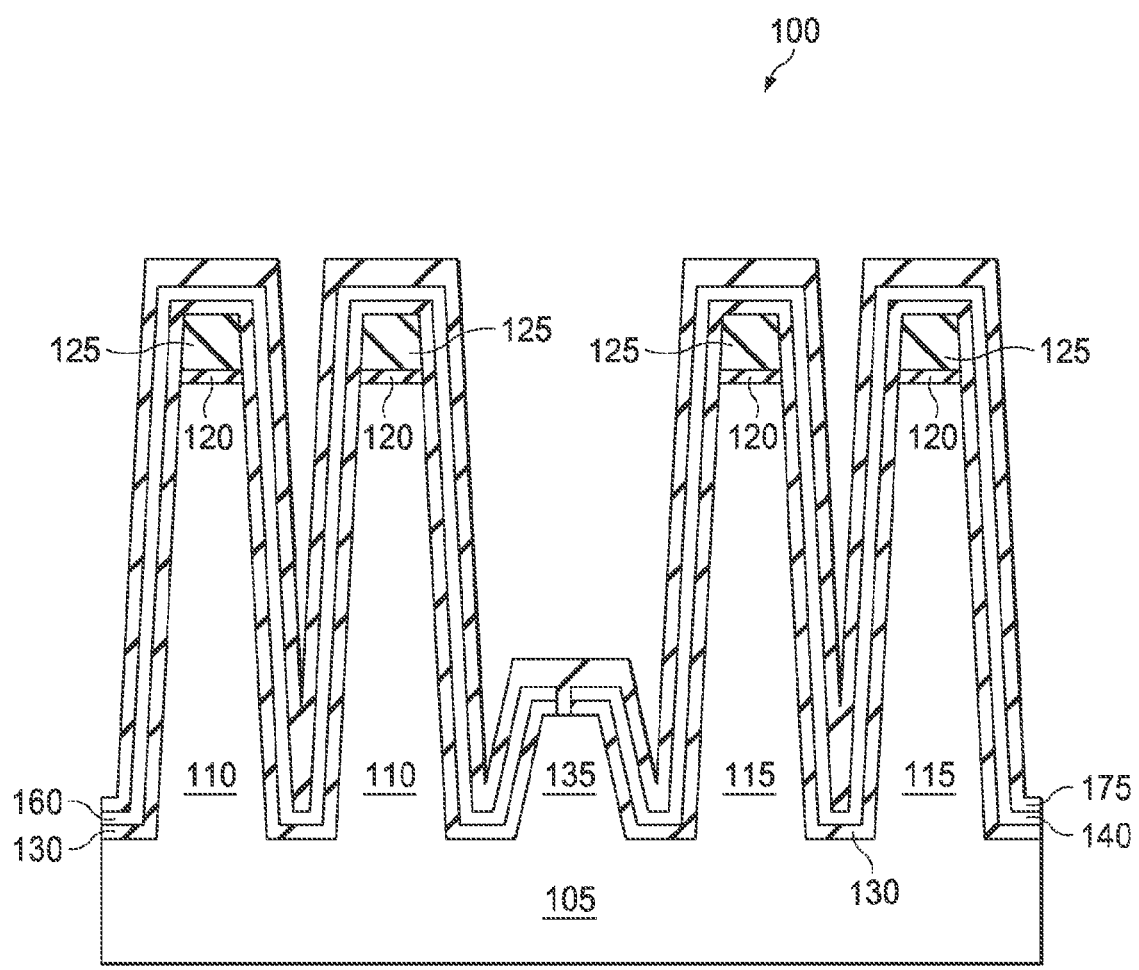
FIG. 16 is a sectional view of the apparatus shown in FIG. 15 in a subsequent stage of manufacture in accordance with some embodiments.

FIG. 16 is a sectional view of the apparatus 100 shown in FIG. 15 in which a diffusion barrier 175 has been formed over the first dopant layer 140, the second dopant layer 160, and perhaps over the gap 107, according to one or more aspects of the present disclosure. The diffusion barrier 175 may comprise silicon nitride, chromium, a conductive ceramic material, and/or other materials, and may be formed by sputtering, CVD, PECVD, MOCVD, FCVD, ALD, PEALD, and/or other processes. The thickness of the diffusion barrier 175 may range between about one micron and about twenty microns, although other thicknesses are also within the scope of the present disclosure.

Figure 17:
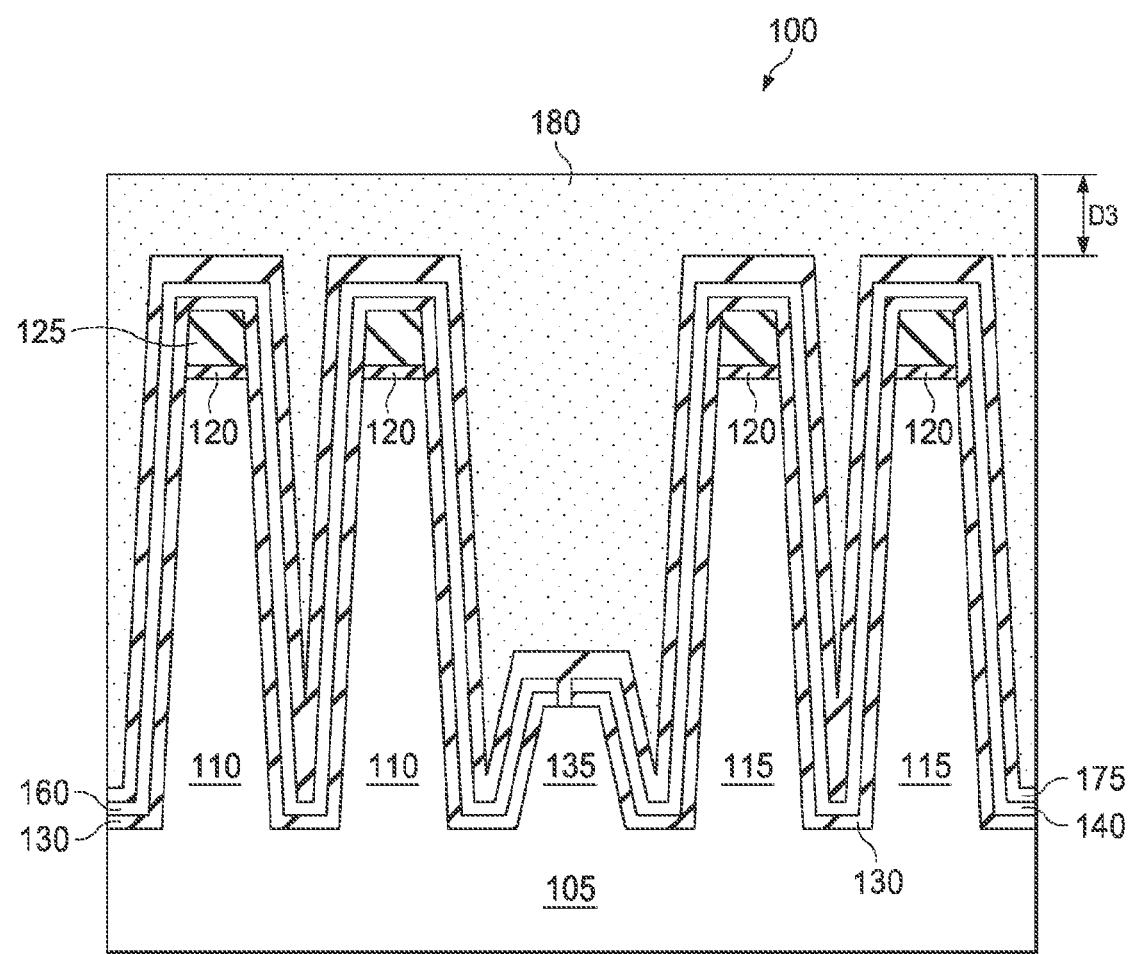
FIG. 17 is a sectional view of the apparatus shown in FIG. 16 in a subsequent stage of manufacture in accordance with some embodiments.

FIG. 17 is a sectional view of the apparatus 100 shown in FIG. 16 in which a BARC 180 has been formed over the diffusion barrier 175 according to one or more aspects of the present disclosure. The BARC 180 may comprise silicon oxynitride and/or other organic or inorganic materials, and may be formed to a distance D3 above an uppermost portion of the etch stop layer 145, thus filling in the spaces between the fins 110 and 115 and/or other features 135. The distance D3 may range between about ten microns and about 1000 microns, although other thicknesses are also within the scope of the present disclosure. One or more CVD, spin-on coating, and/or other processes may be utilized to form the BARC 180.

Figure 18:
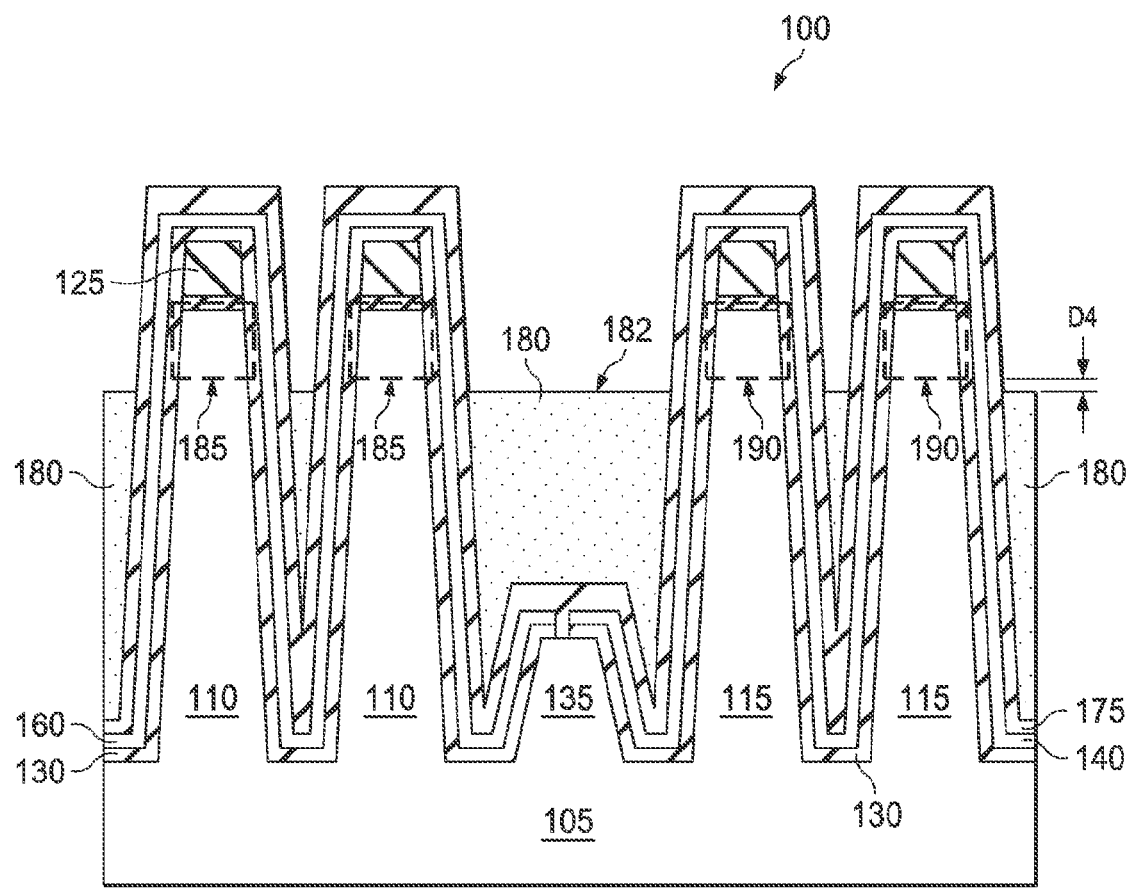
FIG. 18 is a sectional view of the apparatus shown in FIG. 17 in a subsequent stage of manufacture in accordance with some embodiments.

FIG. 18 is a sectional view of the apparatus 100 shown in FIG. 17 in which a portion of the BARC 180 has been removed to expose tip portions 185 of the first fins 110 and tip portions 190 of the second fins 115. Such removal may utilize one or more wet and/or dry isotropic and/or anisotropic etching and/or other material removal processes. The removal process may result in a surface 182 of the BARC 180 being recessed below the tip portions 185 and 190 (in a direction substantially perpendicular to the substrate 105) by a distance D4, which may range between about one nanometer and about ten nanometers, although other dimensions are also within the scope of the present disclosure.

The tip portions 180 and 185 of the first and second fins 110 and 115, respectively, may comprise the tips or uppermost ends of the fins 110 and 115. Thus, the tip portions 180 and 185 may abut or be partially defined by the interface with the dielectric layer 120.

The thickness D4 may be tunable, such as to affect the resistance of the tip portions 185 and 190 of the first and second fins 110 and 115, respectively. For example, reducing the thickness D4 may help to reduce the resistance of the tip portions 185 and 190 and/or increase a conducting current of the apparatus 100.

Figure 19:
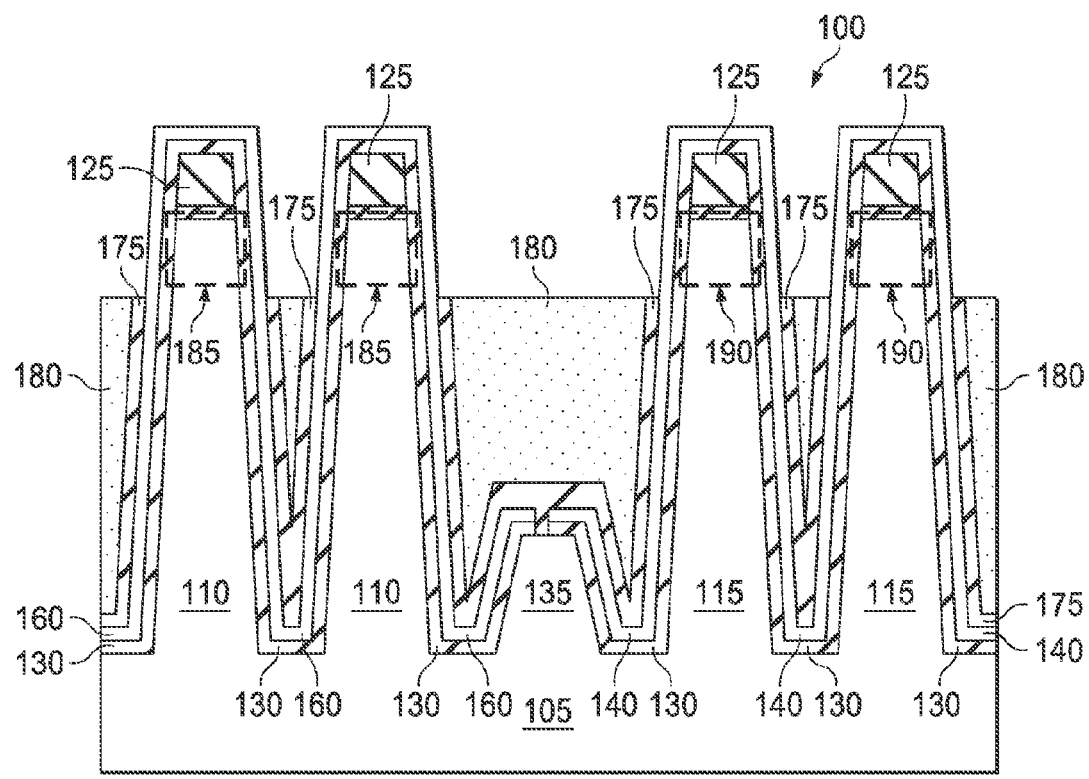
FIG. 19 is a sectional view of the apparatus shown in FIG. 18 in a subsequent stage of manufacture in accordance with some embodiments.

FIG. 19 is a sectional view of the apparatus 100 shown in FIG. 18 in which portions of the diffusion barrier 175 above the BARC 180 have been removed, thus exposing the first dopant layer 140 over the second fins 115 and the second dopant layer 160 over the first fins 110. Such removal may utilize one or more dry and/or wet isotropic and/or anisotropic etching and/or other material removal processes.

Figure 20:
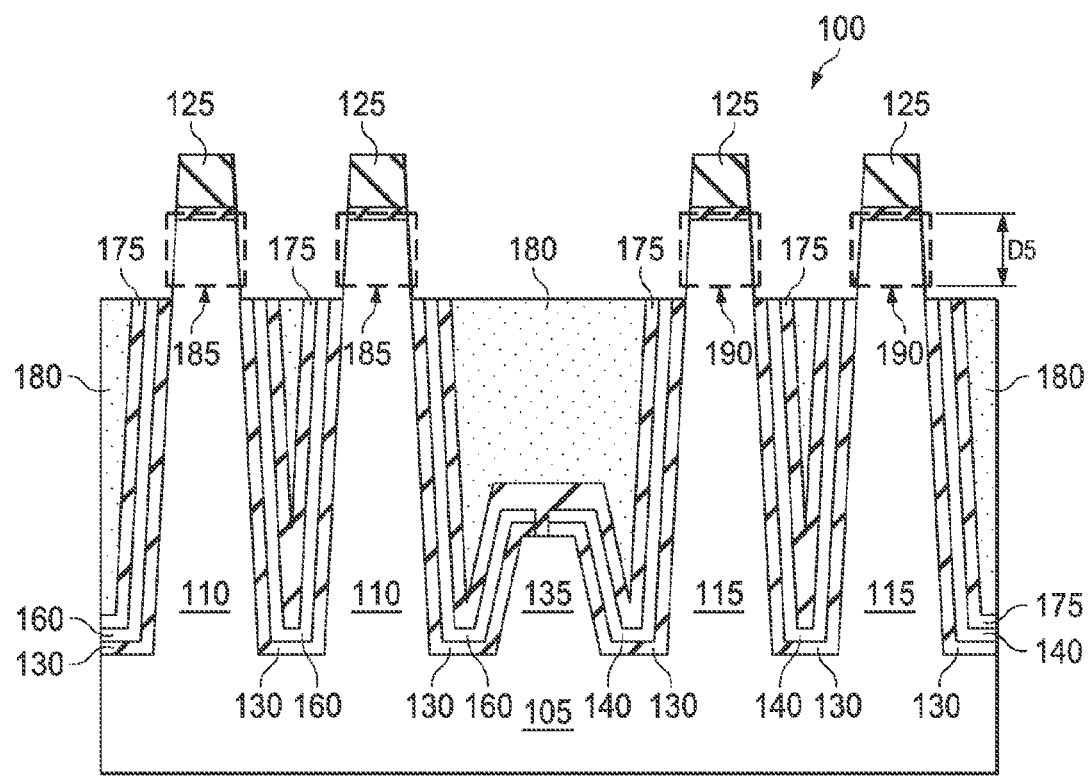
FIG. 20 is a sectional view of the apparatus shown in FIG. 19 in a subsequent stage of manufacture in accordance with some embodiments.

FIG. 20 is a sectional view of the apparatus 100 shown in FIG. 19 in which the first and second dopant layers 140 and 160 have been removed from over the surface 182 of the BARC 180, thus exposing the tip portions 185 of the first fins 110 and the tip portions 190 of the second fins 115. Such material removal may utilize one or more dry and/or wet isotropic and/or anisotropic etching and/or other material removal processes. FIG. 20 also demonstrates that the tip portions 185 of the first fins 110 and the tip portions 190 of the second fins 115 may have a thickness D5. The thickness D5 may range between about ten nanometers and about 100 nanometers. For example, the thickness D5 may be about 33 nanometers. However, other dimensions are also within the scope of the present disclosure.

Figure 21:
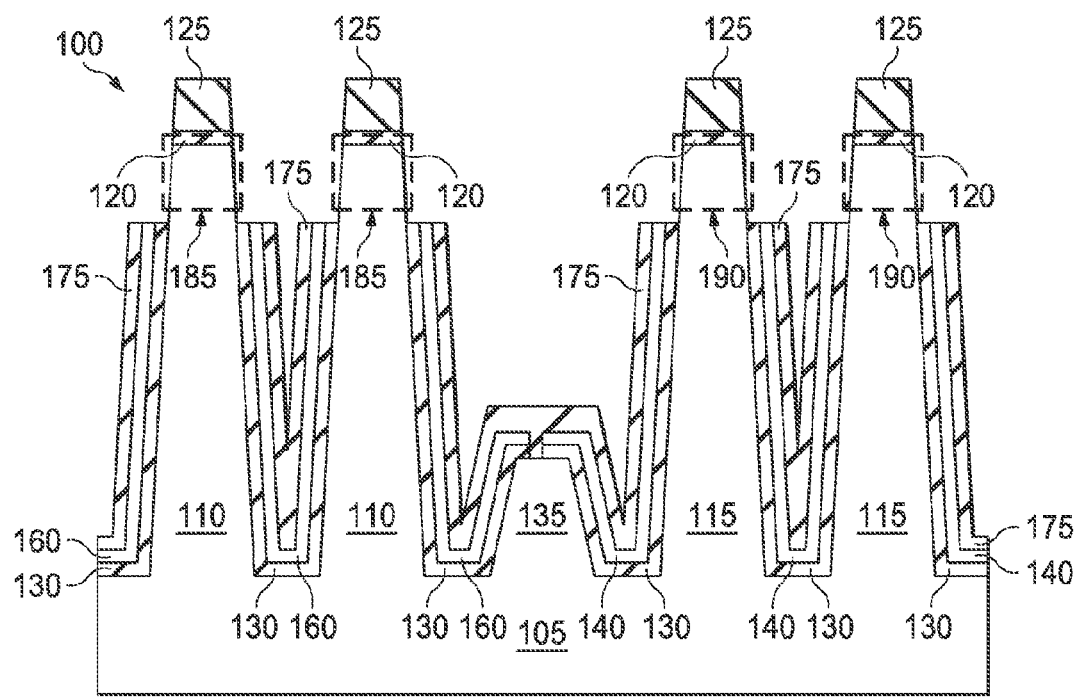
FIG. 21 is a sectional view of the apparatus shown in FIG. 20 in a subsequent stage of manufacture in accordance with some embodiments.

FIG. 21 is a sectional view of the apparatus 100 shown in FIG. 20 in which the remaining portions of the BARC 180 have been removed according to one or more aspects of the present disclosure, thus exposing the first and second dopant layers 140 and 160. Such removal may comprise one or more wet and/or dry isotropic and/or anisotropic etching and/or other material removal processes. For example, the removal may utilize one or more high temperature and/or other sulfuric peroxide mixtures, although other material removal compositions and/or processes are also within the scope of the present disclosure.

In some implementations, the patterning performed to remove portions of the BARC 180, the diffusion barrier 175, the first dopant layer 140, the second dopant layer 160, and/or the liner layer 130, thus arriving at the manufacturing stage depicted in FIG. 21, may be substantially the same process. That is, two or more of the BARC 180, the diffusion barrier 175, the first dopant layer 140, the second dopant layer 160, and the liner layer 130 may be patterned substantially simultaneously.

Figure 22:
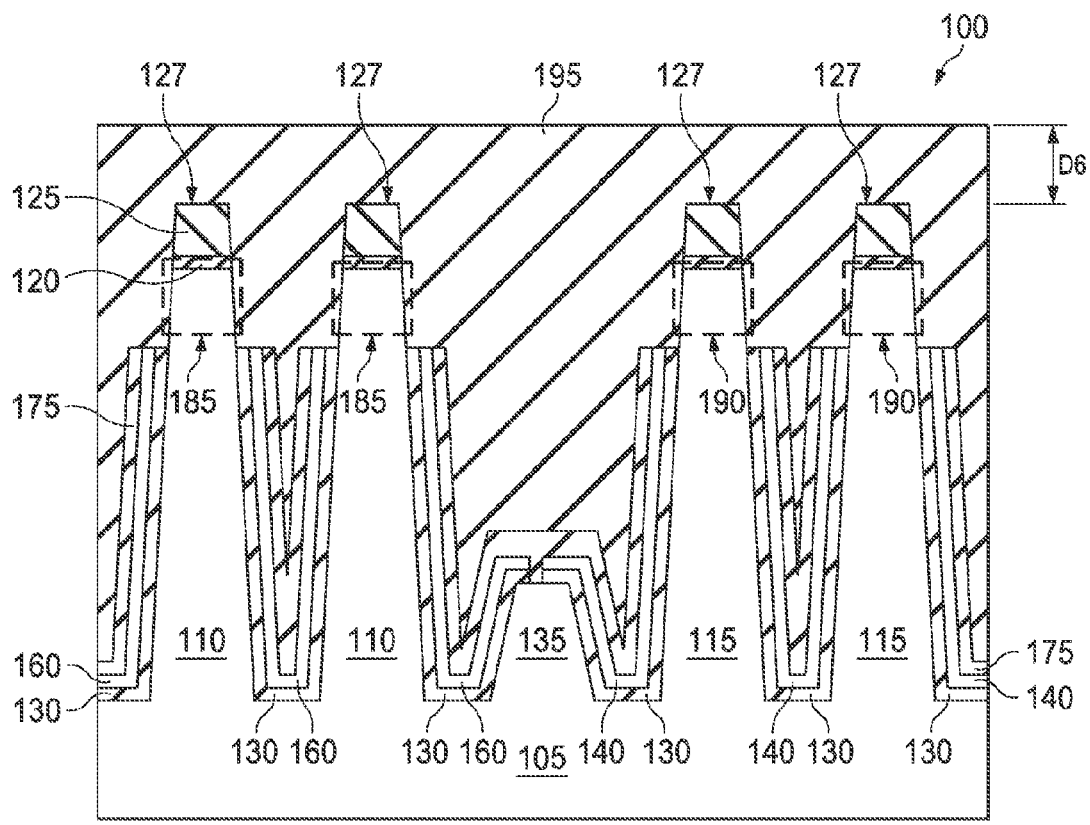
FIG. 22 is a sectional view of the apparatus shown in FIG. 21 in a subsequent stage of manufacture in accordance with some embodiments.

FIG. 22 is a sectional view of the apparatus 100 shown in FIG. 21 in which a shallow trench isolation (STI) material 195 has been formed over the diffusion barrier 175, the exposed tip portions 185 and 190 of the first and second fins 110 and 115, respectively, and the dielectric layer 120 and/or an etch stop layer 125 covering ends of the fins 110 and 115. The STI material 195 may comprise silicon dioxide and/or other dielectric materials, and may be formed to a distance D6 above uppermost portions of the etch stop layers 125, including filling in the spaces between the tip portions 185 and 190 of the fins 110 and 115 and/or other features 135. The distance D6 may range between about ten microns and about 1000 microns, although other thicknesses are also within the scope of the present disclosure. One or more CVD, spin-on coating, and/or other processes may be utilized to form the STI material 195.

In some implementations, one or more oxide layers may be formed by PEALD and/or other processes after the BARC 180 is removed and before the formation of the STI material 195. The one or more oxide layers may be formed over the diffusion barrier 175, the exposed tip portions 185 and 190 of the first and second fins 110 and 115, respectively, and the dielectric layer 120 and/or an etch stop layer 125 covering ends of the fins 110 and 115. The STI material 195 may then be formed on the one or more oxide layers. The one or more oxide layers may also be formed in lieu of the STI material 195.

Regardless of whether one or both of the oxide layers and the STI material 195 are formed, one or more annealing processes may be performed at this stage to affect the solid phase diffusion of dopant from the first dopant layer 140 into the non-tip portions of the second fins 115 and the solid phase diffusion of dopant from the second dopant layer 160 into the non-tip portions of the first fins 110. For example, after the formation of the STI material 195 and/or the above-described oxide layer(s), a first annealing process may be performed, perhaps before and/or after one or more cleaning processes. Thereafter, a second annealing process may be performed, perhaps before and/or after one or more chemical-mechanical planarization (CMP) and/or other planarization processes performed to planarized the STI material 195 and/or the above-described oxide layer(s) relative to upper surfaces 127 of the etch stop layers 125 (relative to the orientation shown in FIG. 22). The one or more annealing processes may entail subjecting the apparatus 100 to a temperature ranging between about 100° C. and about 1200° C. for a time period ranging between about ten minutes and about ten hours. However, other annealing parameters are also within the scope of present disclosure.

Figure 23:
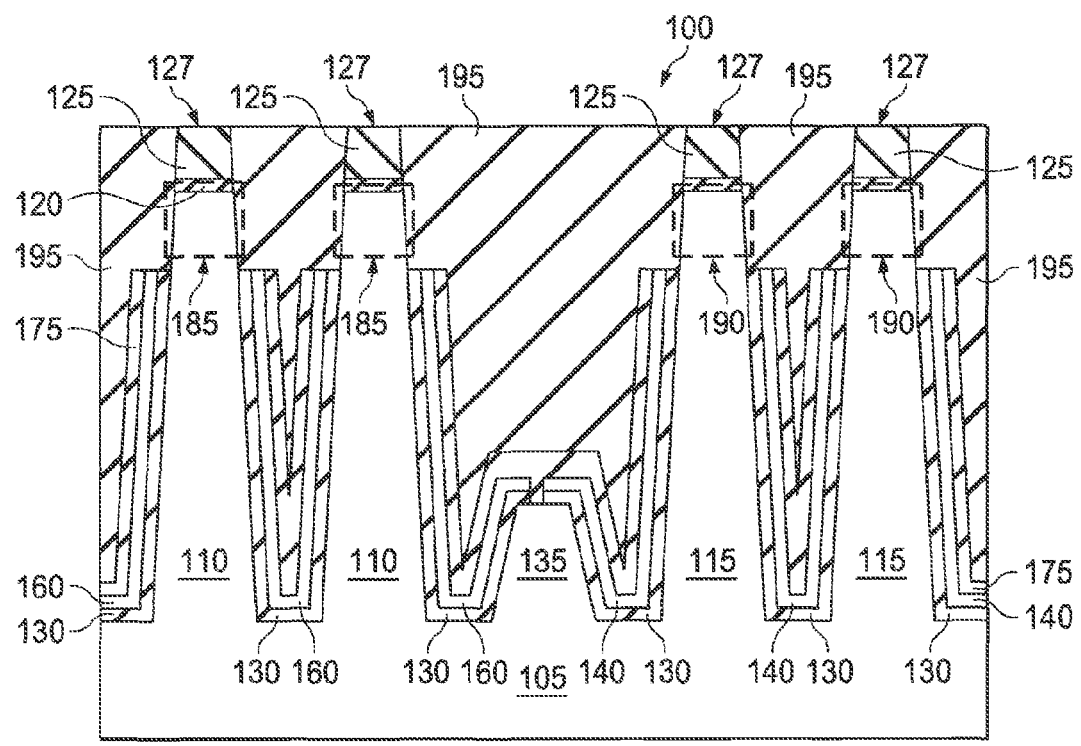
FIG. 23 is a sectional view of the apparatus shown in FIG. 22 in a subsequent stage of manufacture in accordance with some embodiments.

FIG. 23 is a sectional view of the apparatus 100 shown in FIG. 22 after such planarization, such that the remaining STI material 195 is substantially flush with the upper surfaces 127 of the etch stop layers 125 (relative to the orientation shown in FIG. 23). Such removal may comprise one or more CMP processes, wet and/or dry isotropic and/or anisotropic etching processes, and/or other material removal processes.

Figure 24:
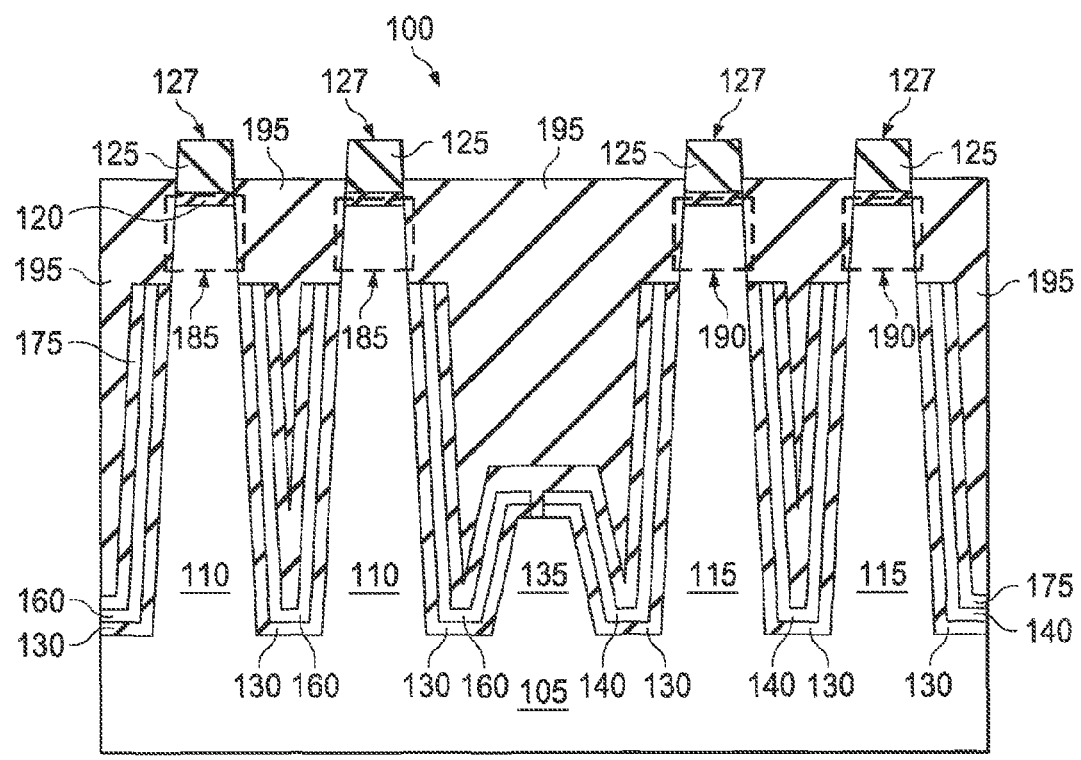
FIG. 24 is a sectional view of the apparatus shown in FIG. 23 in a subsequent stage of manufacture in accordance with some embodiments.

FIG. 24 is a sectional view of the apparatus 100 shown in FIG. 23 in which an additional portion of the STI material 195 has been removed to below the upper surfaces 127 of the etch stop layers 125 (relative to the orientation shown in FIG. 24), thus exposing at least a portion of the etch stop layers 125 and/or the dielectric layer(s) 120. Such removal may comprise one or more CMP processes, wet and/or dry isotropic and/or anisotropic etching processes, and/or other material removal processes.

Figure 25:
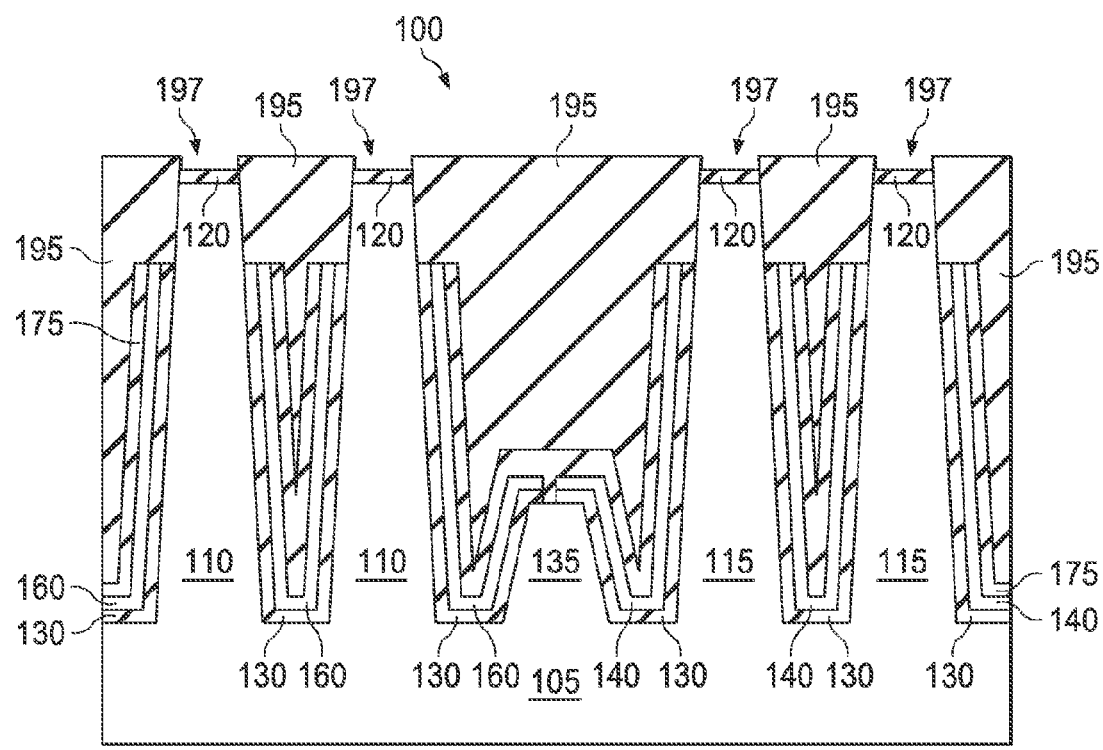
FIG. 25 is a sectional view of the apparatus shown in FIG. 24 in a subsequent stage of manufacture in accordance with some embodiments.

FIG. 25 is a sectional view of the apparatus 100 shown in FIG. 24 in which the remaining portions of the etch stop layer 125 have been removed, thus exposing the underlying dielectric layer 120 over the first and second fins 110 and 115 through openings 197 in the STI material 195. Such removal may utilize one or more wet and/or dry isotropic and/or anisotropic etching and/or other material removal processes.

Figure 26:
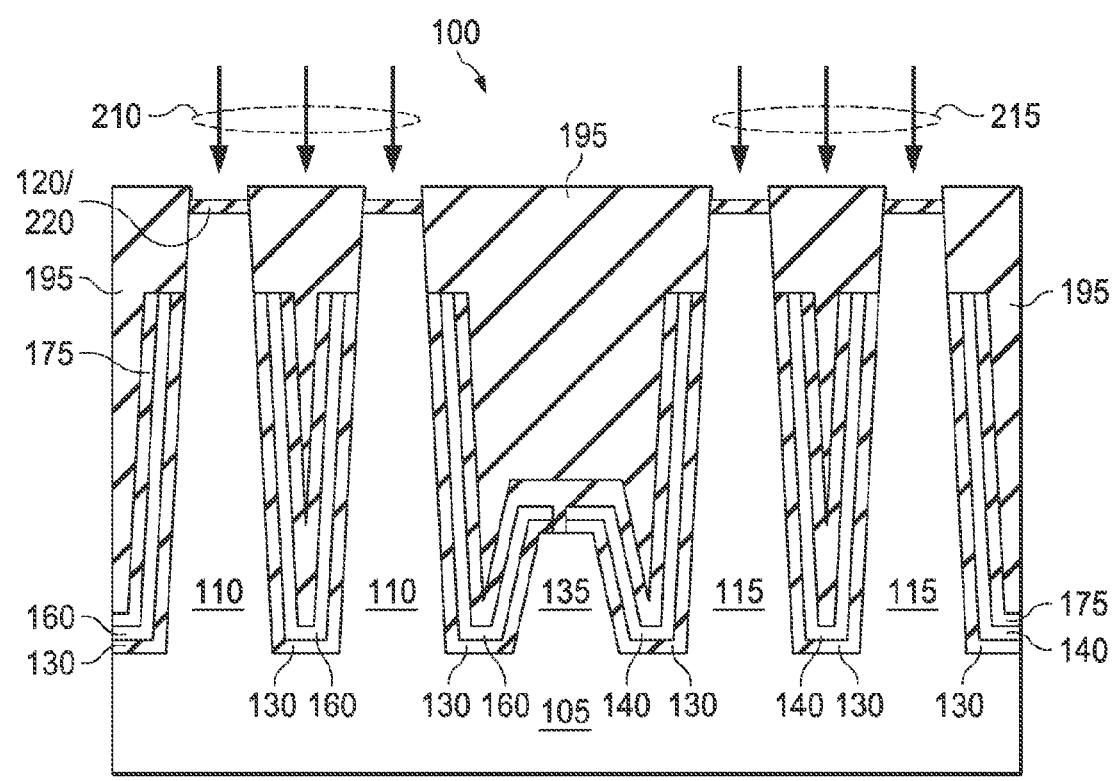
FIG. 26 is a sectional view of the apparatus shown in FIG. 25 in a subsequent stage of manufacture in accordance with some embodiments.

FIG. 26 is a sectional view of the apparatus 100 shown in FIG. 25 in which one or more implanting, cleaning, and/or annealing processes are being performed, as depicted by arrows 210 and 215. As symbolized by the different length and width of the arrows 215 relative to the arrows 210, the implanting, cleaning, and/or annealing processes performed over the first fins 110 may be different relative to the implanting, cleaning, and/or annealing processes performed over the second fins 120.

As also depicted in FIG. 26, the remaining portions of the dielectric layer(s) 120 may be replaced with one or more sacrificial oxide layers 220. For example, one or more wet and/or dry isotropic and/or anisotropic etching and/or other material removal processes may be utilized to remove the remaining portions of the dielectric layer(s) 120, and one or more sacrificial oxide layers 220 may be formed on the exposed ends of the tip portions 185 and 190 of the fins 110 and 115, respectively. Formation of the one or more sacrificial oxide layers 220 may comprise one or more in-situ steam generation (ISSG) processes, sputtering, CVD, PECVD, MOCVD, FCVD, ALD, PEALD, and/or other processes. The thickness of the one or more sacrificial oxide layers 220 may individually or collectively range between about one nanometer and about twenty microns, although other thicknesses are also within the scope of the present disclosure.

Figure 27:
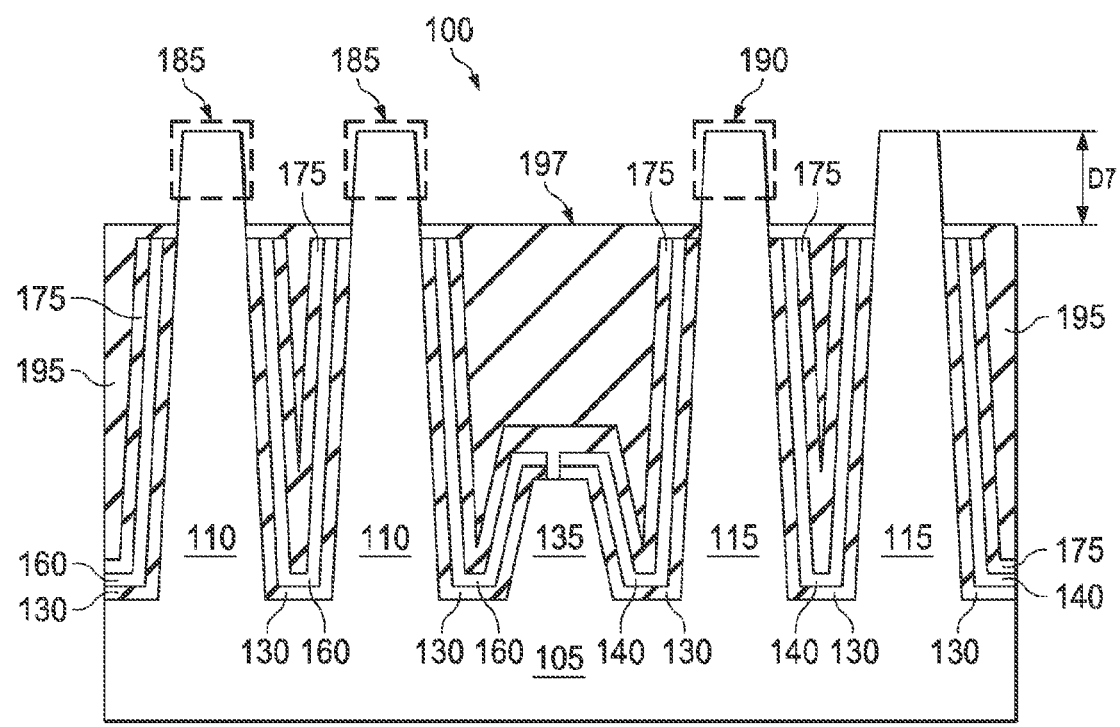
FIG. 27 is a sectional view of the apparatus shown in FIG. 26 in a subsequent stage of manufacture in accordance with some embodiments.

FIG. 27 is a sectional view of the apparatus 100 shown in FIG. 26 in which the dielectric layer 120 or the one or more sacrificial oxide layers 220 have been removed and the STI material 195 has been recessed to expose the tip portions 185 and 190 of the fins 110 and 115, respectively. Such removal may utilize one or more wet and/or dry isotropic and/or anisotropic etching and/or other material removal processes. The distance D7 between the resulting surface 197 of the STI material 195 and the exposed upper surfaces of the tip portions 185 and 190 of the fins 110 and 115, respectively, may range between about ten nanometers and about 100 nanometers, or between about 30 nanometers and about 50 nanometers, such as about 38 nanometers, although other dimensions are also within the scope of the present disclosure.

Figure 28:
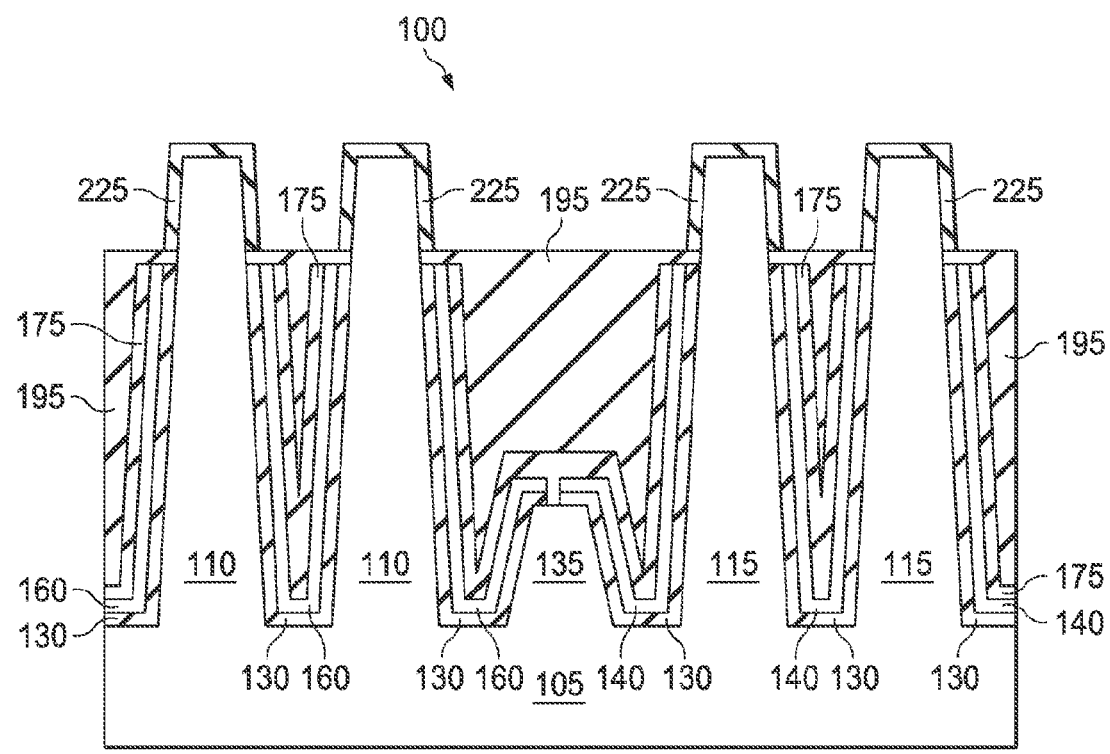
FIG. 28 is a sectional view of the apparatus shown in FIG. 27 in a subsequent stage of manufacture in accordance with some embodiments.

FIG. 28 is a sectional view of the apparatus 100 shown in FIG. 27 in which one or more gate oxide layers 225 have been formed over the exposed portions of the fins 110 and 115. The one or more gate oxide layers 225 may individually or collectively comprise silicon oxide and/or other oxide compositions, and may be formed by sputtering, CVD, PECVD, MOCVD, FCVD, ALD, PEALD, and/or other processes. The thickness of the one or more gate oxide layers 225 may individually or collectively range between about one nanometer and about ten microns, although other thicknesses are also within the scope of the present disclosure.

One or more aspects introduced in the present disclosure may improve function and/or operation relative to existing apparatus, perhaps by improving device mobility and/or conductive current. The height(s) of exposed portions of the fins 110 and 115 may also be tunable, such as to reduce resistance of the tip portions 185 and 190, respectively, and/or to increase conductive current of the apparatus. Additionally, dopant concentration profiles within non-tip portions of the fins 110 and 115 (i.e., those portions between the substrate 105 and the tip portions 185 and 190, respectively) may be substantially uniform and/or otherwise have improved uniformity along a direction parallel to the nearest portion of the corresponding dopant layer. For example, such dopant concentration profiles may vary substantially only in a direction perpendicular to the nearest portion of the corresponding dopant layer. Such dopant concentration provides may aid in improving mobility. One or more aspects of the present disclosure may also or alternatively permit maximum dopant concentrations ranging between about $1E18$ $cm^{-3}$ and about $1E19$ $cm^{-3}$. Moreover, these and/or other aspects of such dopant concentration profiles may be achieved by one or more solid phase diffusion processes and/or otherwise in the absence of ion implanting processes.

In view of the entirety of the present disclosure, including the figures, a person having ordinary skill in the art will readily recognize that the present disclosure introduces a method comprising forming first and second fins extending from a substrate, and forming a first layer over the first fin, wherein the first layer comprises a first dopant. Such method further comprises removing a portion of the first layer from a tip portion of the first fin. A second layer comprising a second dopant is formed over the second fin. One of the first and second dopants may be a p-type dopant, and the other of the first and second dopants may be an n-type dopant. A portion of the second layer is removed from a tip portion of the second fin. A solid phase diffusion process is performed to diffuse the first dopant into a non-tip portion of the first fin, and to diffuse the second dopant into a non-tip portion of the second fin.

The present disclosure also introduces an apparatus comprising first and second fins extending from a substrate. A first layer covers a non-tip portion the first fin and comprises a first non-implanted dopant. A second layer covers a non-tip portion of the second fin and comprises a second non-implanted dopant. One of the first and second non-implanted dopants may be a p-type dopant, and the other of the first and second non-implanted dopants may be an n-type dopant.

The present disclosure also introduces an apparatus comprising first and second fins extending from a substrate. A first layer covers a non-tip portion the first fin and comprises a first dopant according to a first concentration profile that is substantially uniform relative to a boundary between the first layer and the first fin. A second layer covers a non-tip portion of the second fin and comprises a second dopant according to a second concentration profile that is substantially uniform relative to a boundary between the second layer and the second fin. One of the first and second dopants may be a p-type dopant, and the other of the first and second dopants may be an n-type dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming first and second fins extending from a substrate;
   forming a first layer over the first fin, wherein the first layer comprises a first dopant;
   removing a portion of the first layer from a tip portion of the first fin;
   forming a second layer over the second fin, wherein the second layer comprises a second dopant, wherein one of the first and second dopants is a p-type dopant and the other of the first and second dopants is an n-type dopant;
   removing a portion of the second layer from a tip portion of the second fin; and
   performing a solid phase diffusion process to:
      diffuse the first dopant into a non-tip portion of the first fin; and
      diffuse the second dopant into a non-tip portion of the second fin.

2. The method of claim 1, wherein performing the solid phase diffusion process comprises annealing to diffuse the first and second dopants into the non-tip portions of the first and second fins, respectively.

3. The method of claim 1, wherein performing the solid phase diffusion process comprises:
   performing a first anneal to diffuse the first dopant into the non-tip portion of the first fin; and
   performing a second anneal to diffuse the second dopant into the non-tip portion of the second fin.

4. The method of claim 1, wherein the first layer comprises phosphosilicate glass and the second layer comprises borosilicate glass.

5. The method of claim 1, wherein the tip portions of the first and second fins are vertically separated from the non-tip portions of the first and second fins, respectively.

6. The method of claim 1 further comprising:
   forming a dielectric layer of a top surface of the first and second fins; and
   forming an etch stop layer over the dielectric layer.

7. The method of claim 1 further comprising forming a spacer between the first and second fins, the spacer extending from the substrate.

8. The method of claim 1 further comprising forming a gap between the first layer and the second layer.

9. The method of claim 1, wherein the tip portions of the first fin and the second fin have a length of between about 25 nanometers and 50 nanometers.

10. A method, comprising:
    forming first and second fins extending from a substrate;
    forming a first dopant layer over the first fin;
    forming a second dopant layer over the second fin, wherein one of the first and second dopant layers includes a p-type dopant and the other of the first and second dopant layers includes an n-type dopant;
    removing the first dopant layer from a tip portion of the first fin;
    removing the second dopant layer from a tip portion of the second fin; and
    performing an annealing process to diffuse dopants from the first dopant layer into a base portion of the first fin and to diffuse dopants from the second dopant layer into a base portion of the second fin.

11. The method of claim 10, wherein the tip portions of the first fin and the second fin have a length of between about 25 nanometers and 50 nanometers.

12. The method of claim 10 further comprising forming a gap between the first and second dopant layers.

13. The method of claim 10 further comprising forming a gate oxide layer over the tip portions of the first and second fins.

14. The method of claim 10, wherein the tip portions of the first and second fins are vertically separated from the base portions of the first and second fins, respectively.

15. A method, comprising:
    forming first and second fins extending from a substrate, the first and second fins having a base portion and a tip portion;
    forming a first dopant over the first fin;
    forming a second dopant over the second fin, the second dopant being a different dopant type than the first dopant;
    removing the first dopant from the tip portion of the first fin;
    removing the second dopant from the tip portion of the second fin; and
    diffusing the first dopant into the base portion of the first fin and diffusing the second dopant into the base portion of the second fin.

16. The method of claim 15, wherein the step of diffusing the first and second dopants includes performing a solid phase diffusion process, the solid phase diffusion process comprises:
    performing a first anneal to diffuse the first dopant into the base portion of the first fin; and
    performing a second anneal to diffuse the second dopant into the base portion of the second fin.

17. The method of claim 15, wherein the first dopant has a first concentration profile and the second dopant has a second concentration profile different from the first concentration profile.

18. The method of claim 15 further comprising forming a spacer between the first and second fins, the spacer extending from the substrate.

19. The method of claim 15 further comprising forming a gate oxide layer over the tip portions of the first and second fins.

20. The method of claim 15, wherein the tip portions of the first fin and the second fin have a length of between about 25 nanometers and 50 nanometers.

* * * * *